(12) United States Patent
Geerlings

(10) Patent No.: US 10,607,975 B2
(45) Date of Patent: Mar. 31, 2020

(54) HEXAGONAL PACKING LASER ABLATION

(71) Applicant: Gentex Corporation, Zeeland, MI (US)

(72) Inventor: Kurtis L. Geerlings, Zeeland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 16/231,357

(22) Filed: Dec. 21, 2018

(65) Prior Publication Data

US 2019/0221553 A1     Jul. 18, 2019

Related U.S. Application Data

(60) Provisional application No. 62/618,874, filed on Jan. 18, 2018.

(51) Int. Cl.
    *H01L 25/16*        (2006.01)
    *H01L 27/146*      (2006.01)
    *H01L 31/0203*     (2014.01)
    *G02B 5/08*         (2006.01)

(52) U.S. Cl.
    CPC .............. *H01L 25/167* (2013.01); *G02B 5/08* (2013.01); *H01L 27/14629* (2013.01); *H01L 31/0203* (2013.01)

(58) Field of Classification Search
    None
    See application file for complete search history.

(56) References Cited

U.S. PATENT DOCUMENTS

| | | | |
|---|---|---|---|
| 2012/0273472 A1 | 11/2012 | Unrath et al. | |
| 2016/0199936 A1* | 7/2016 | Luten | B23K 26/0661 |
| | | | 359/275 |
| 2016/0370680 A1* | 12/2016 | Geerlings | G02F 1/155 |
| 2017/0239749 A1 | 8/2017 | Geerlings et al. | |
| 2017/0277009 A1* | 9/2017 | Luten | B23K 26/57 |

FOREIGN PATENT DOCUMENTS

WO    WO2008/119949    10/2008
WO    WO2016/054590    4/2016

OTHER PUBLICATIONS

International Search Report re Application No. PCT/US2018/067391 dated Mar. 7, 2019; 7 pgs.

* cited by examiner

*Primary Examiner* — Shaun M Campbell
(74) *Attorney, Agent, or Firm* — Foley & Lardner LLP; Bradley D. Johnson

(57) ABSTRACT

A substrate has a first side and an opposing second side. The opposing second side has a first portion and a second portion. The substrate is at least partially transparent to visible light. A coating layer is disposed over the first portion but not the second portion of the opposing second side of the substrate. The second portion has an ablated surface including a hexagonal packed surface profile.

18 Claims, 14 Drawing Sheets

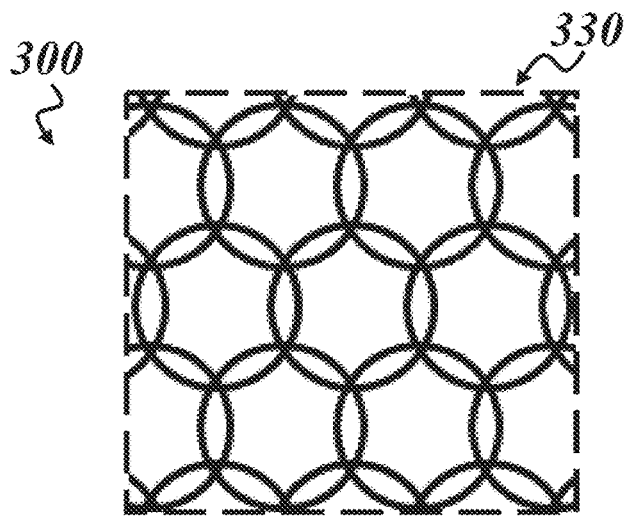
*FIG. 15*
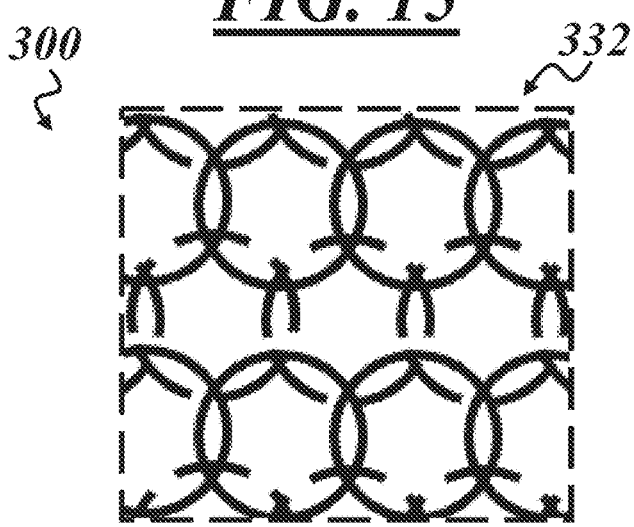
*FIG. 16*
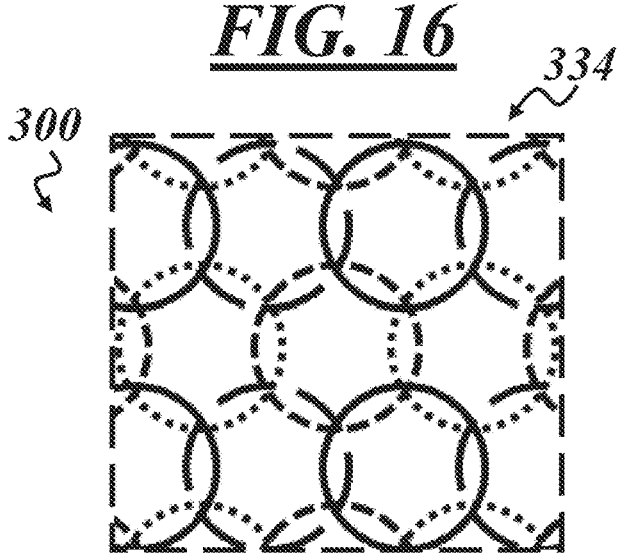
*FIG. 17*
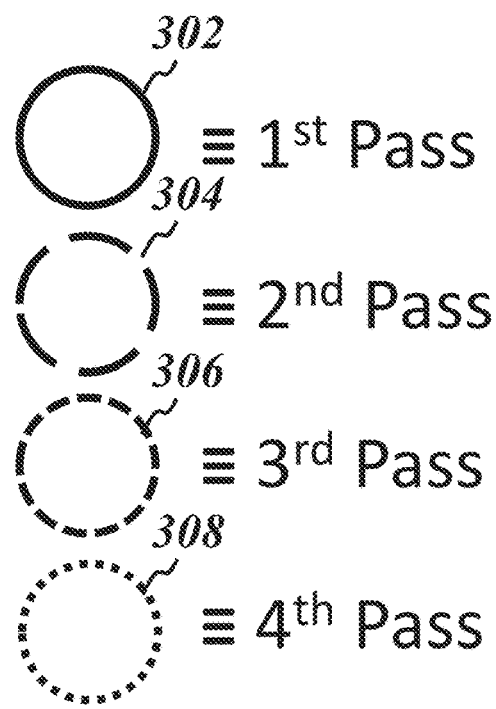

HEXAGONAL PACKING LASER ABLATION

CROSS-REFERENCE TO RELATED PATENT APPLICATIONS

This application claims the benefit of U.S. Provisional Application No. 62/618,874, filed Jan. 18, 2018, which is incorporated herein by reference in its entirety.

TECHNICAL FIELD

The present disclosure generally relates to laser ablation processes and products produced thereby.

SUMMARY

One embodiment relates to a substrate for an electro-optic dimmable device. The substrate has a first side and an opposing second side. The opposing second side has a first portion and a second portion. The substrate is at least partially transparent to visible light. A coating layer is disposed over the first portion but not the second portion of the opposing second side of the substrate. The second portion has an ablated surface including a hexagonal packed surface profile.

Another embodiment relates to an electro-optic mirror device. The electro-optic mirror device includes a substrate. The substrate has a first surface, an opposing second surface, and a conductive layer disposed on the opposing second surface. The conductive layer has a hexagonally packed surface profile including a plurality of rows, each of the plurality of rows having a plurality of laser spots. The plurality of laser spots of each of the plurality of rows have a pulse spacing and the plurality of rows have a pitch. The plurality of laser spots of a respective row are laterally offset relative to the plurality of laser spots of a preceding row and a subsequent row. The lateral offset of the respective row relative to the preceding row and the subsequent row being approximately half the pulse spacing such that a center of a respective laser spot of the respective row substantially aligns with a center of two adjacent laser spots in the preceding row and the subsequent row.

Still another embodiment relates to a method for manufacturing a product. The method includes providing a substrate having a first side and an opposing second side, the opposing second side having a coating layer disposed thereon; impinging the substrate with a laser beam such that the laser beam propagates through the first side to the opposing second side and interacts with the coating layer to remove the coating layer from the opposing second side, leaving a laser spot on a surface of the opposing second side; and moving the laser beam along the substrate to remove the coating layer from at least a portion of the opposing second side of the substrate leaving a plurality of rows, each of the plurality of rows including a plurality of laser spots on the surface of the opposing second side, the plurality of laser spots arranged in a hexagonal packing profile. The plurality of laser spots of each row of laser spots have a pulse spacing and the plurality of rows have a pitch. The plurality of laser spots of a respective row are laterally offset by approximately half the pulse spacing relative to the plurality of laser spots of a preceding row such that a center of a respective laser spot of the respective row substantially aligns with a center of two adjacent laser spots in the preceding row.

BRIEF DESCRIPTION OF THE DRAWINGS

Illustrative embodiments will hereinafter be described in conjunction with the appended drawings, wherein like designations denote like elements.

FIG. 15 is a detailed schematic view of a single pass hexagonal packing laser ablation process, according to an exemplary embodiment.

FIG. 16 is a detailed schematic view of a line interleaving hexagonal packing laser ablation process, according to an exemplary embodiment.

FIG. 17 is a detailed schematic view of a four-pass interleaving hexagonal packing laser ablation process, according to an exemplary embodiment.

DETAILED DESCRIPTION

Figure 1:
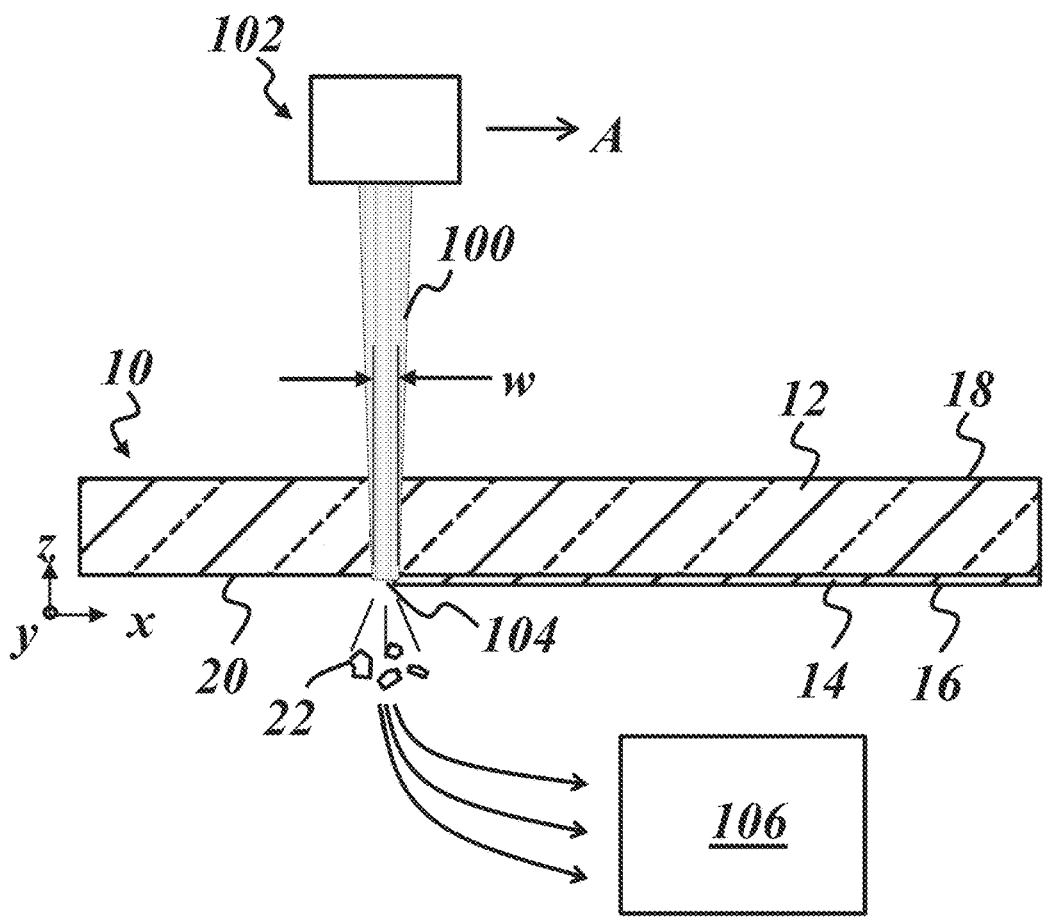
FIG. 1 is a side cross-sectional view of a second surface laser ablation process, according to an exemplary embodiment.

A laser ablation process generally includes selective removal of material at a surface of a workpiece by directing a laser beam at the workpiece. The laser beam is configured to deliver a controlled amount of energy at a laser spot defined where the beam impinges the desired surface. This controlled amount of energy is selected to liquefy, vaporize, or otherwise rapidly expand the surface material at the laser spot to cause it to separate from the workpiece for removal. Laser ablation can be used to remove at least a portion of one or more coatings from a coated substrate, for example, or to otherwise reshape the workpiece surface.

Conventional laser ablation process may produce artifacts on the workpiece surface that create an undesired diffraction pattern when light is shone on or through the ablated surface. The diffraction effect is produced by artifacts with a periodic arrangement which are formed on the ablated surface (i.e., resulting from the fact that the laser ablation is accomplished using a series of spot ablations that are introduced sequentially along a path as opposed to being the result of a continuous laser "sweep" across the surface; this periodic arrangement of ablation points induces a corresponding periodic arrangement of artifacts, as will be described in greater detail below). In some cases, the diffraction effect may be present but may not be severe enough to be objectionable.

The artifacts produced in conventional laser ablation processes may produce a diffraction effect when the artifacts have a period (i.e., spacing) in the range of about 4,500 nanometers (nm) to about 850,000 nm. The artifacts may be arranged in rows, such that there is a periodic spacing of the artifacts within each row and a periodic spacing between adjacent rows. The rows may extend in the scan or process path direction of the ablation process, with the artifacts being formed by overlap of the laser spots in the scan direction (e.g., when using a non-interleaving laser ablation process, etc.). The artifacts in adjacent rows may or may not be aligned. The distance between the rows may be defined by the offset or pitch of the scan lines in the laser ablation process. In some embodiments, the period of the artifacts in the scan or process direction within the row may be about 45,000 nm, and the period between the rows in the line offset direction may be about 85,000 nm.

The height of the artifacts produced by the laser ablation process may also affect the diffraction severity. The height of the artifacts may be referred to as the "peak-to-valley" distance, and extends perpendicular or substantially perpendicular to the major plane in which the workpiece extends. The peak-to-valley distance that produces a diffraction severity of less than about 5 is impacted by the media adjacent to the surface containing the artifacts. In some embodiments where the adjacent medium is air, a diffraction severity of less than about 5 may be produced by a peak-to-valley distance of less than about 15 nm, such as less than about 10 nm, or less than about 7.5 nm. In other embodiments where the adjacent medium has a refractive index greater than 1, a diffraction severity of less than about 5 may be produced by a peak-to-valley distance of less than about 25 nm, such as less than about 18 nm, or less than about 13 nm. An adjacent medium with a refractive index greater than one may be any appropriate material, such as an electrochromic material when the ablated workpiece is included in an electrochromic device. Greater detail regarding diffraction severity may be found in U.S. patent application Ser. No. 15/186,164, filed Jun. 17, 2016.

FIG. 1 is a side cross-sectional view of an example of a laser ablation process as performed on a workpiece 10. The workpiece 10 is a coated substrate, including a substrate 12 and a coating layer 14. The illustrated process is a second surface ablation process in which the coating layer 14 is located at a second side 16 of the workpiece 10 opposite a first or impingement side 18 of the workpiece 10. A laser beam 100 is provided by a laser source 102 and propagates toward the workpiece. In this example, the laser beam 100 is configured with a focal plane at or near a second surface 20 of the substrate 12 and generally parallel with the x-y reference plane to define a laser spot 104 with a characteristic size such as a diameter or width w at the second surface. In other examples, the focal plane can be spaced from the second surface 20 by an amount greater than 0 mm up to about 50 mm. The substrate 12 is at least partially transparent to the particular wavelength of laser light of the laser beam 100 so that the laser beam 100 passes through the thickness of the substrate 12 to the second surface 20, where the material of the coating layer 14 absorbs at least some of the energy of the laser beam 100 and is thereby separated from the substrate 12.

In the example of FIG. 1, the removed coating layer material 22 is illustrated in the form of solid particles (although the removed material 22 may be in vapor or liquid form when initially separated from the substrate 12 according to other exemplary embodiments). The workpiece 10 can be oriented as shown so that gravity causes the removed material 22 to fall away from the workpiece 10. Optionally, a vacuum source 106 is provided to help guide the removed material 22 away from the workpiece 10. The illustrated arrangement may be useful to prevent the removed material 22 from being redeposited on the workpiece 10, which can be problematic with some first surface ablation processes. The material may also be removed via a spallation process.

Figure 2:
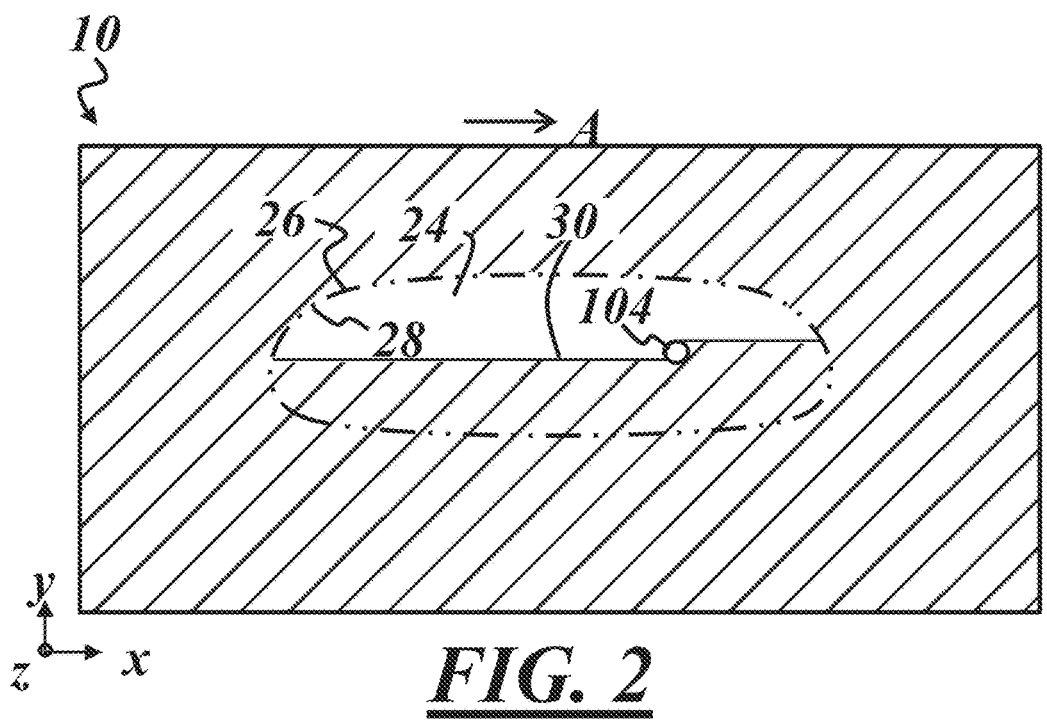
FIG. 2 is a top view of the second surface laser ablation process of FIG. 1, according to an exemplary embodiment.

In order to remove material from an area of the workpiece 10 that is larger than the laser spot 104, the laser beam 100 and/or the workpiece 10 may be moved relative to each other to remove material at a plurality of adjacent and/or overlapping laser spot locations. For instance, after the desired amount of material is removed at a first laser spot location, the workpiece 10 and/or laser beam 100 may move to define a second laser spot location for further removal of material. Continued movement to multiple adjacent and/or overlapping laser spot locations with corresponding material removal at each location defines an ablated area 24 of the workpiece 10 from which material has been removed, as shown in a top view of the process in FIG. 2, where an intended ablation area 26 is shown in phantom. In FIGS. 1 and 2, the laser beam 100 is moving in an instant process direction A with respect to the workpiece 10. One or both of the laser beam 100 or the workpiece 10 may be moved to achieve this relative movement. In one example, the laser beam 100 moves or scans back and forth in the positive and negative x-direction within the intended ablation area 26, and the laser beam 100 and/or the workpiece 10 is indexed in the y-direction each time the laser beam 100 reaches an edge 28 of the intended ablation area 26 until the coating layer 14 is removed within the entire intended ablation area 26 (e.g., a non-interleaving laser ablation process, a serpentine laser ablation process, etc.). In another example, the laser beam 100 moves or scans back and forth in the positive and negative x-direction within the intended ablation area 26 where consecutive laser spots 104 (e.g., adjacent spots, a first laser spot and a subsequent laser spot, etc.) in the x-direction are physically spaced from each other (e.g., do not overlap, etc.), and the laser beam 100 and/or the workpiece 10 is indexed in the y-direction each time the laser beam 100 reaches an edge 28 of the intended ablation area 26. The consecutive laser spots 104 (e.g., adjacent spots, a first laser spot and a subsequent laser spot, etc.) in the y-direction may also be physically spaced from each other (e.g., do not overlap, etc.). The laser beam 100 may take a plurality of passes across the entire intended ablation area 26, each of the passes at least partially offset from the previous pass such that the entire intended ablation area 26 is scanned after the plurality of passes (e.g., all of the coating layer 14 is removed from the intended ablation area 26, an interleaving laser ablation process, etc.).

Figure 3:
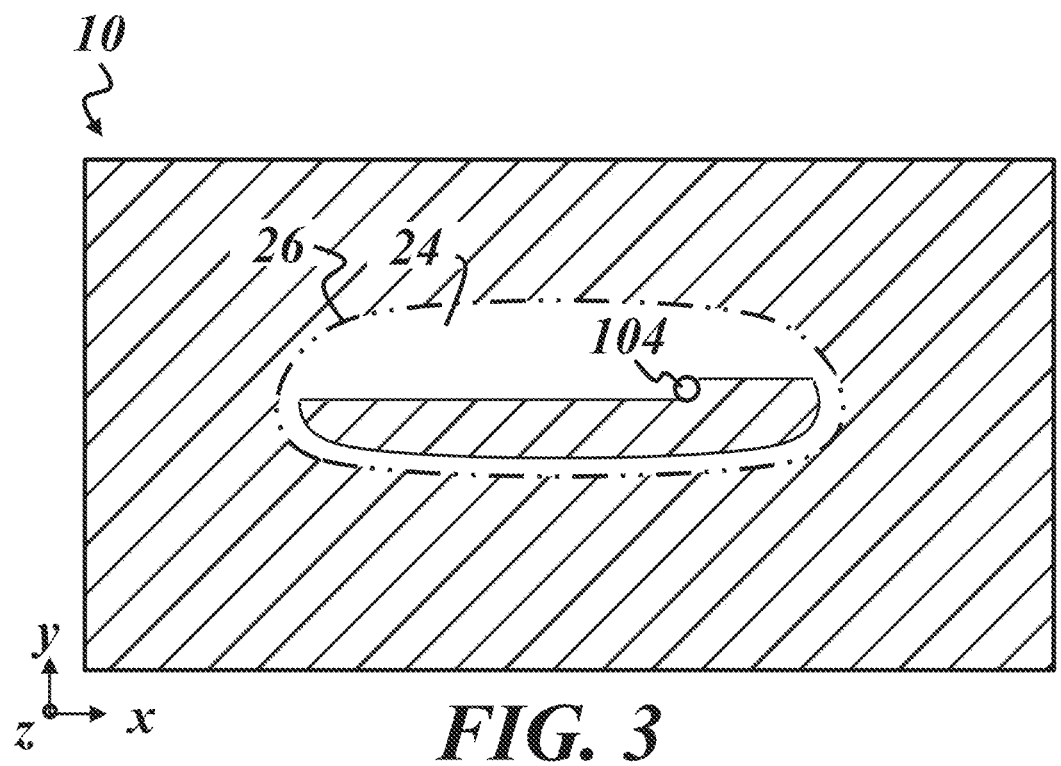
FIG. 3 is a top view of the second surface laser ablation process of FIG. 1, according to another exemplary embodiment.

FIG. 3 illustrates an embodiment in which the laser ablation process is performed along a perimeter of the intended ablation area 26 before the remaining portion within the perimeter is ablated. The speed of the laser beam with respect to the workpiece 10 along the process path may be constant in the instantaneous direction of movement along the perimeter of the intended ablation area 26 to achieve a uniform edge at the perimeter. Performing the ablation process such that a portion of the overall process path follows the shape of the perimeter of the intended ablation area 26 facilitates use of a larger laser beam cross-section and shorter process times by enabling the use of less overlap in one of the index axes while also providing a processed edge at the perimeter of the ablation area that has a smooth appearance, particularly with non-rectangular ablation areas that have curvilinear edges such as in FIGS. 2 and 3. Alternatively, the perimeter of the ablation area can be the final portion of the area from which the coating layer is removed.

The process is of course not limited to removing the entire coating layer in any particular area of the workpiece. The laser ablation process can be used to selectively remove coating material to form decorative patterns, functional patterns, and/or indicia, for example. Desired patterns or indicia can be formed from the portion of the coating layer remaining over the substrate after the ablation process, or they can be formed by the ablated area itself. Second surface ablation has the additional advantage that, due to the at least partially transparent substrate, decorative features or indicia can be viewed through the first side of the finished product. The ablated workpiece can be assembled with the remaining coating layer facing toward the inside of an assembly such that it is protected from damage and from the environment by the substrate.

A high-frequency pulsed laser may be used in conjunction with workpiece 10 and/or laser beam 100 movement at a particular rate in the process direction to determine the spacing between adjacent laser spot locations. In a non-limiting example, a laser beam operating with a pulse frequency of 400 kHz with a rate of movement with respect to the workpiece of 20 m/s in the process direction will result in laser spot locations every 50 µm in the process direction. Laser spot locations may overlap when the cross-sectional dimension of the laser beam 100, measured in the process direction, is greater than the spacing between adjacent laser spot locations (e.g., a serpentine laser ablation process, etc.). A single pulse or a pulse burst may be delivered at each laser spot location, where the pulse durations are generally one or more orders of magnitude less than the time between pulses. Spacing among laser spot locations may be selected so that adjacent spot locations at least partially overlap to ensure material removal between adjacent locations, particularly with non-rectangular beam cross-sections. In some embodiments, the artifacts and/or the arrangement thereof are referred to or considered as a periodic structure or periodic structures.

Figure 4:
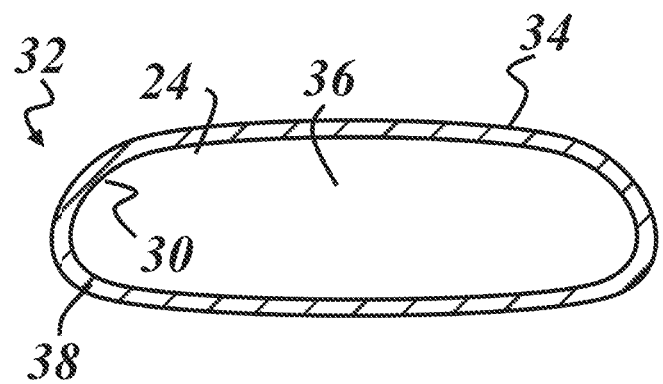
FIG. 4 is a component formed from the ablated workpiece of FIGS. 2 and 3, according to an exemplary embodiment.

FIG. 4 illustrates one example of a component 32 that can be formed from the ablated workpiece. Component 32 is taken from the interior of the workpiece 10 of FIG. 2 or FIG. 3 by cutting, scoring, or otherwise separating it from the surrounding portion of the ablated workpiece. In one embodiment, a series of laser induced damage channels can be formed in the substrate along a desired line of separation to facilitate removal of the component 32 from the ablated workpiece. Examples of laser induced damage channels and processes for forming them in a substrate are described in greater detail by Bareman et al. in U.S. Pat. No. 8,842,358. An edge 34 of the component 32 is formed along the line of separation. In this example, the edge 34 circumscribes the ablated area 24 formed during the ablation process and is generally parallel with the processed edge 30 of the remaining coating layer. The component 32 thus formed includes a window 36 with approximately the transparency of the substrate and a border 38 having the optical and other physical properties of the coating layer material.

The border 38, and in fact the coating layer of the original workpiece, may be formed from nearly any material (e.g., metallic, plastic and/or ceramic) and may generally be less transparent than the substrate. Certain metallic materials, such as chromium or chromium-containing materials, may be multi-functional, providing reflectivity, opacity, conductivity, along with a potentially decorative aspect. In some embodiments, the coating layer as provided to the ablation process is itself a multi-layer coating. For instance, the coating layer may include a reflective layer in direct contact with the substrate and a light-absorbing layer over the reflective layer to minimize reflection of the laser light in the ablation process. In other embodiments, some of which are described below in further detail, the workpiece may include an additional layer between the substrate and the coating layer. The additional layer may be any appropriate material. In some embodiments, the additional layer may be at least partially transparent, and may have a transparency substantially similar to the transparency of the substrate. The additional layer may conduct electricity, and in some embodiments may be formed of a transparent conductive oxide (TCO). In some embodiments, the additional layer may be a dielectric layer. In some embodiments, the additional layer may include multiple layers as part of a multi-layer stack structure. The multi-layer stack structure may include one or more layers of TCO materials, dielectric materials, insulator materials, metal materials, and/or semiconductor materials. The selection of materials for inclusion in the additional layer may be influenced by the refractive index, thickness or sequencing of the layers to achieve a desired reflectance, transmittance, and/or color in the ablated area, non-ablated area, or both. In the description below the additional layer may be referred to as a conductive layer, but it is understood that other additional layer materials described herein may be employed in place of the conductive layer. The coating layer can be selectively ablated from the TCO or dielectric layers. The coating layer may include one or more reflective layers comprising one or more metallic material, metal oxide, metal nitride or other suitable material that provides both reflectivity and opacity. In one embodiment, the workpiece includes a glass substrate, a layer of indium tin oxide (ITO) on the glass substrate, with a coating layer that includes sequential and adjacent layers of chromium (Cr), ruthenium (Ru), Cr, and Ru to form a glass/ITO/Cr/Ru/Cr/Ru material stack.

In one embodiment, the component 32 or similar component having a coating layer from which material has been laser ablated, is a mirror component, such as a component of a vehicle rearview mirror assembly. The border 38 of the component 32 may serve to eliminate the need for a separate frame for such a mirror and may also serve other functions, such as providing electrical conductivity, electrical insulation, reflectivity, and/or concealing electrical connections or other mirror assembly components. In one particular example, the component 32 is a front/outside piece and/or a rear/inside piece of an electrochromic mirror assembly (e.g., a first substrate, etc.) in which an electrochromic medium is encapsulated in a cavity formed between the back side of the component 32 (i.e., the second side 16 of the original workpiece 10 of FIG. 1) and a second similarly shaped component (e.g., a second substrate, a substrate including one or more of the same or similar features/elements as the component 32, etc.). Some examples of electrochromic mirror assemblies are also given in the above-referenced U.S. Pat. No. 8,842,358 and in some of the documents referenced therein, which are incorporated herein by reference in their entireties. Other non-mirror electrochromic devices (e.g., electrochromic windows or lenses) may also be formed from the ablated workpiece, as can non-electrochromic assemblies. In another example, the component 32 is configured to be incorporated into a dimming mirror assembly. In yet another example, the component 32 is configured to be incorporated into a chrome ring product.

Some devices that may employ at least a portion of the laser ablated workpiece, such as electrochromic devices, may require one or more electrically conductive layers such as an electrode layer. In an electrochromic device, for example, electrodes may be included on opposite sides of the electrochromic medium wherever it is desired to activate the electrochromic medium in the device. The component 32 may thus also include an electrically conductive layer along at least a portion of the window 36, corresponding to the ablated area 24 of the original workpiece. The electrically conductive layer may be formed from a TCO or other suitable conductive material, such as ITO. In one embodiment, the conductive layer overlies the entire window 36.

Figure 5:
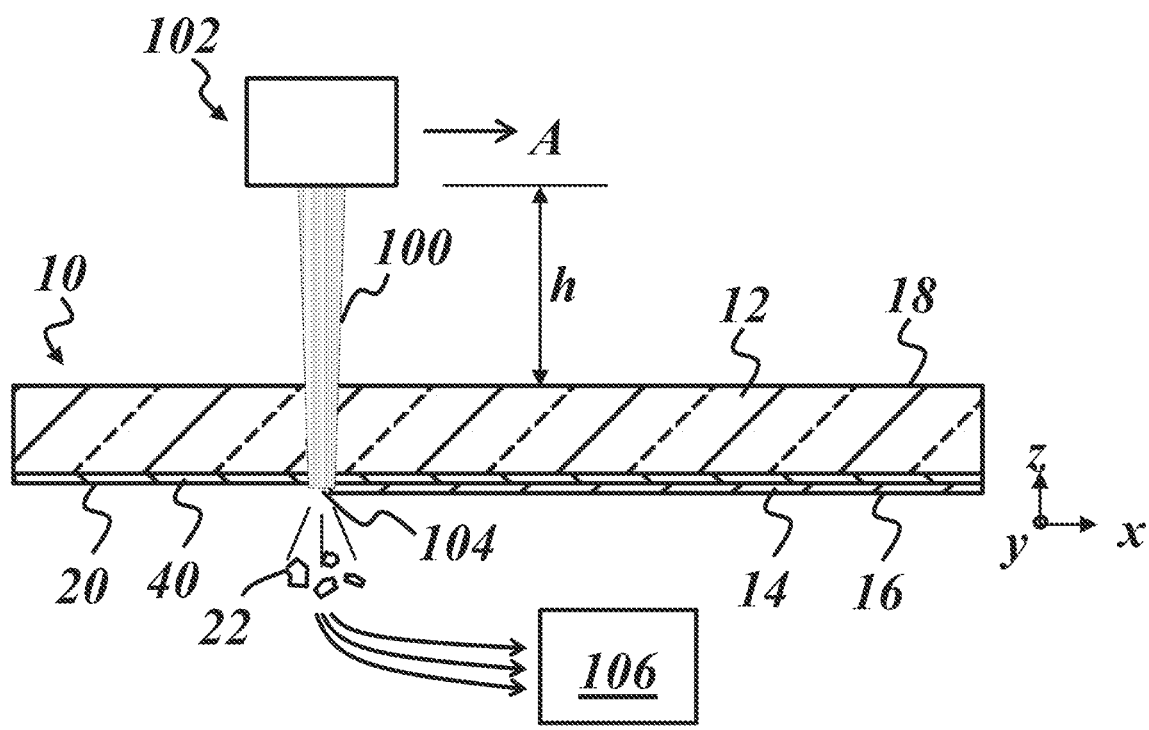
FIG. 5 is a side cross-sectional view of a second surface laser ablation process, where the workpiece includes an additional material layer, according to an exemplary embodiment.

As shown in FIG. 5, the above-described second surface laser ablation process is compatible with TCO materials or other at least partially transparent conductive layers. The materials are at least partially transparent to the wavelength of the laser employed in the laser ablation process. The workpiece 10 in the illustrated process includes an electrically conductive layer 40 at the second side 16 of the workpiece between the substrate 12 and the coating layer 14. The conductive layer 40 provides the second surface 20 from which the coating layer 14 is removed, in this example. The illustrated process represents an example of a laser ablation process in which the laser beam 100 propagates through the conductive layer 40, such as a metallic layer or TCO layer, to remove material from an opposite side of the conductive layer. In other embodiments, the electrically conductive layer may be disposed over the second side of the workpiece after the ablation process. This alternative allows for application of the conductive layer only on selected workpieces. The laser wavelength may be selected to minimize absorption by the conductive layer. In one non-limiting example, a laser having a wavelength of 532 nm is used with an ITO conductive layer in order to minimize absorption or damage to the conductive layer 40. In other embodiments, other wavelengths such as an IR laser at 1060 nm could be used.

Figure 6:
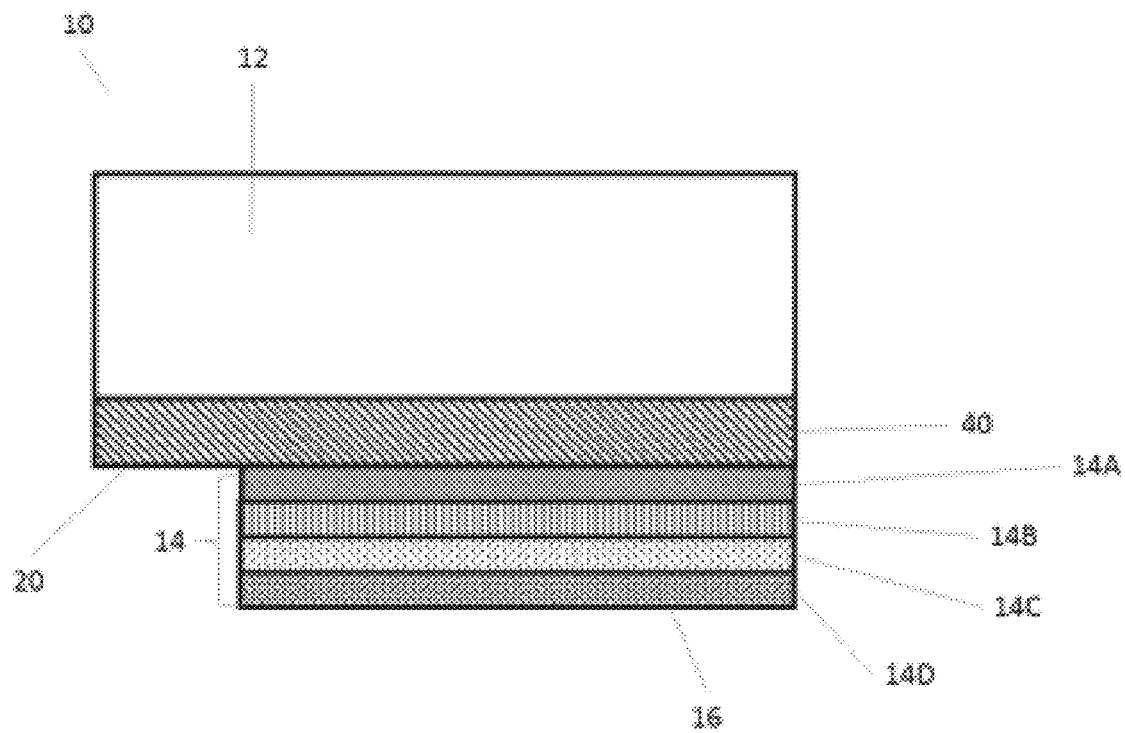
FIG. 6 is a side cross-section view of the workpiece of FIG. 4 that has been subjected to the second surface laser ablation process, where the additional material layer includes a plurality of sub-layers, according to an exemplary embodiment.

As shown in FIG. 6, the coating layer 14 may be a single layer or multi-layer. The function of each layer in the multi-layer may be selected to perform different physical, chemical, and/or optical functions. For example, referring to FIG. 6, the coating layer 14 may be subdivided into multiple sub-layers. In some embodiments, a sub-layer 14A adjacent the conductive layer 40 may be an adhesion promoting layer, such as a layer including Cr or Ti. A second sub-layer 14B may be a reflecting layer. The reflecting layer may include a silver-gold alloy chrome, ruthenium, stainless steel, silicon, titanium, nickel, molybdenum, chromium-molybdenum-nickel alloys, nickel chromium, nickel-based alloys, Inconel, indium, palladium, osmium, cobalt, cadmium, niobium, brass, bronze, tungsten, rhenium, iridium, aluminum, aluminum alloys, scandium, yttrium, zirconium, vanadium, manganese, iron, zinc, tin, lead, bismuth, antimony, rhodium, tantalum, copper, gold, platinum, any other platinum group metals, alloys whose constituents are primarily the aforementioned materials, and combinations thereof. A third sub-layer 14C may be an opacifying layer. The opacifying layer may include nickel silicide, chrome, nickel, titanium, Monel, cobalt, platinum, indium, vanadium, stainless steel, aluminum titanium alloys, niobium, ruthenium, molybdenum tantalum alloys, aluminum silicon alloys, nickel chrome molybdenum alloys, molybdenum rhenium alloys, molybdenum, tungsten, tantalum, rhenium, alloys whose constituents are primarily the aforementioned materials, and combinations thereof. The opacifying layer may include materials with real and imaginary refractive indices being relatively large, such as oxides, nitrides, or the like. A fourth sub-layer 14D may be an electrical stabilization layer. The electrical stabilization layer may include the platinum group metals, such as iridium, osmium, palladium, platinum, rhodium, ruthenium, and their alloys or mixtures. Additionally, the coating layer 14 may be further sub-divided such that any sub-layer may comprise further sub-layers within themselves to meet the requirements of the stack.

The relationship between laser wavelength and energy absorption by the materials in the workpiece highlights at least one surprising result of performing laser ablation through transparent materials. It has been found that, although certain substrates and/or coatings, such as glass and ITO, are visibly transparent, they may absorb at least a portion of the energy in each laser pulse when passing therethrough. Material selection and process parameters must be selected and/or adjusted accordingly. For instance, different glass formulations may have different absorption spectra. One glass formulation may include trace elements with an absorption peak at or near the laser wavelength and thus may absorb some percentage of light passing therethrough, while another glass formulation may transmit essentially all of the incident light. The same holds true for coating layer materials. Absorption of laser energy by the substrate 12 and/or the conductive layer 40 may be characterized by a threshold level above which the coating layer 14 cannot be removed without damage to the substrate 12 and/or the conductive layer 40. Above this threshold, such a large portion of the laser energy is absorbed while passing through the workpiece 10 that increasing the laser pulse energy to a level sufficient to remove the coating layer 14 while accounting for the substrate 12 and/or conductive layer 40 absorption also surpasses the damage threshold for the substrate 12 and/or conductive layer 40.

It has also been found that the laser beam can be used to selectively alter one or more properties of a material layer through which it passes when the material layer has a non-zero absorption at the wavelength of the laser beam. For instance, during a second surface laser ablation process performed through a conductive layer 40, such as a layer of ITO or other TCO, one or more of the following characteristics of the layer 40 may be altered: surface roughness, electrical resistance, work function, carrier mobility and/or concentration. Further, certain characteristics may be altered by different amounts within the layer thickness, and layer thickness can be used to alter or control laser energy distribution within the overall stack of material layers. Some of these changes may be manifested in changes to final product behavior, such as when the conductive layer 40 is an electrode layer in an electrochromic device formed from the ablated workpiece.

In one example, the surface roughness of the additional layer 40 is increased at the ablated area of the workpiece relative to the surface roughness of the additional layer 40 as measured before the coating layer 14 to be ablated is applied. Increased surface roughness may have positive or negative effects, depending on the end application. For instance, increased roughness may correspond to increased surface area in some applications (i.e., more surface contact with an electrochromic (EC) medium in EC devices) or better surface wetting or adhesion in other applications. If surface roughness is sufficiently high, reduced clarity (i.e., more scattering of light) could result on a transparent substrate, which could be advantageous or detrimental, depending on the application. Performing laser ablation through a coating layer that is not removed thus represents an unconventional approach to altering surface characteristics of the unremoved coating layer.

Where the additional layer 40 is electrically conductive, the laser beam may alter the electrical resistance of the layer. Though the mechanism is not fully understood, electrical resistance can be affected in both directions. In some cases, where a sufficiently large amount of laser energy is absorbed by the conductive layer 40, the electrical resistance can increase, possibly due to some damage or breakdown within the layer. In other cases, a smaller amount of energy absorption within the conductive layer can result in lower electrical resistance.

In certain embodiments, another property of the conductive layer 40 affected by the laser beam passing therethrough is the work function of the conductive layer. This changed characteristic has been shown to manifest itself in a functioning electrochromic device made from the ablated workpiece, where the ablated area of the workpiece darkens at a higher or lower rate than unablated areas of the same workpiece.

Certain semi-conducting properties of the conductive layer may also be altered by the laser beam during the ablation process, such as carrier concentration and/or carrier mobility. For instance, these material characteristics may be selectively altered at the ablated surface either by removal of a portion of the conductive layer, or by preferentially modifying the surface properties by exposure to the laser beam.

One manner of controllably affecting these and other changes in the additional material layer 40 is via the thickness of the layer. For example, increased thickness of an additional material layer that absorbs a portion of the laser light passing therethrough increases the total amount of energy absorbed in the layer 40 and may increase the effect the laser has on the layer 40. The thickness of layer 40 may also affect the uniformity of the property change or changes. For instance, the property changes may be greater at one portion of the thickness of the layer 40 than at another portion of the thickness, and increased thickness may increase the property gradient. In another example, the thickness of the additional layer 40 can be used to affect the distribution of laser energy in other layers of the workpiece. For instance, a self-focusing effect may occur within the layer 40, and the thickness of the layer may affect where the electric field is concentrated within the multiple layers of materials.

One manner of optimizing the laser ablation process is to maximize the removal rate of the coating layer 14 by maximizing the cross-sectional size of the laser beam 100 and the associated laser spot 104 (e.g., via selection of laser optics), along with the speed at which the laser is rastered along the workpiece 10. This optimization is limited by the flux at the second surface 20 being reduced as the square of the beam radius at the surface. Above a threshold spot size, the energy flux falls below the ablation threshold for the coating layer, resulting in a net loss of performance. It is thus useful to configure the laser spot size and raster speed to just above the ablation threshold to reduce the process cycle time. A large spot size improves overall coating removal rate, but it may limit the size scale on which indicia can be formed, even in the absence of masking. For example, if a 200 micron diameter laser spot size is used to rapidly remove the coating layer, smooth and/or fine features on a 50 or 100 micron scale cannot be formed, whether part of indicia or other features, due both to the overall size of the spot and its round shape. But formation of features smaller than the laser spot is problematic, even with shaped beams. Some processes employ a second, smaller beam to form the small features while using a larger optimized beam to remove the bulk of the coating layer material.

Picosecond lasers are configured to deliver the energy necessary for coating material removal in laser pulses with durations in a range from about 0.5 to about 500 picosends (ps). Pulse durations of several tens of picoseconds may be preferred, such as 1-50 ps or 50 ps or less. Commercially available picosecond lasers can provide pulse durations of less than 20 ps, less than 10 ps, less than 5 ps, or less than 1 ps, to name a few. Femtosecond lasers having a pulse duration in a range from about 0.5 to about 500 femtoseconds (fs) can provide some of the same advantages as picosecond lasers when compared with nanosecond lasers (0.5 to 500 ns pulse duration).

With further reference to FIGS. 5 and 6, experiments have been conducted to quantify changes to the conductive layer 40 when the laser beam passes through the conductive layer during an ablation process that removes coating layer 14 material from the workpiece 10. In these experiments, the conductive layer 40 was ITO deposited on a sodalime float glass substrate 12 and had a thickness of about 1.6 mm. ITO thickness was varied from workpiece to workpiece as a controlled variable. The coating layer 14 was chromium deposited on the ITO and had a thickness, such as approximately 50 nm, sufficient to arrive at visible light transmittance of approximately 0.4%. The laser ablation was performed using a picosecond laser.

As noted above, results of the ablation process depend on several parameters, including laser spot size, pulse energy, pulse width (i.e., pulse duration), laser wavelength, and/or spot-to-spot distance. Each layer, and in particular the coating layer 14, has an absorbed energy threshold at and above which physical removal of the layer will occur due to breaking of bonds (i.e., intermolecular, intramolecular, adhesive, etc.). The absorbance of each material in the workpiece 10, and thus the amount of energy absorbed at each location within the thickness of the workpiece, is a function of the wavelength of the laser light.

Absorbance also depends on the local intensity of the laser light. While this dependence can often be ignored, the relatively high peak pulse power delivered by ultra-short pulse lasers, such as picosecond, femtosecond, and certain nanosecond lasers, make this intensity-dependence relevant and sometimes dominant. Therefore, pulse width (i.e., pulse d duration) is a relevant process parameter, especially in processes employing ultra-short pulse lasers. Pulse width also influences the dynamics of the energy absorption by the coating layer during the ablation process. For instance, relatively longer pulses may lead to heat dissipation in the coating layer material adjacent to and outside of the laser spot and can have the effect of reducing the temperature reached within the laser spot and/or can have the effect of damaging or otherwise affecting coating layer material outside of the laser spot. Material outside of the laser spot that is affected due to heat absorbed during the ablation process defines a heat-affected zone (HAZ) of the coating layer.

Generally, a smaller laser pulse width leads to a smaller HAZ. Ablated material takes absorbed heat with it and potentially helps reduce the size of the HAZ in the unremoved coating layer material.

The various advantages of a hexagonal and/or hexagonal interleaving laser ablation processes relative to a non-interleaving, linear serpentine laser ablation process is described in more detail herein with reference to FIGS. 7-10 (indicative of a non-interleaving linear serpentine process) and FIGS. 11-17 (indicative of a hexagonal packing and/or an interleaving hexagonal packing laser ablation process).

Referring now to FIGS. 7-17, (i) a first surface profile formed using a non-interleaving, linear serpentine laser ablation process and the characteristics thereof (e.g., diffracted light patterns, amount of light diffraction, peak-to-valley height, surface profile, etc.) and (ii) a second surface profile formed using a hexagonal packing laser ablation process and/or an interleaving hexagonal packing laser ablation process, and the characteristics thereof (e.g., diffracted light patterns, amount of light diffraction, peak-to-valley height, surface profile, etc.) are shown, according to an exemplary embodiment. According to an exemplary embodiment, the hexagonal packing laser ablation process and the interleaving hexagonal laser ablation process provide various advantages relative to the non-interleaving, linear serpentine laser ablation process. By way of example, the hexagonal packing laser ablation processes may advantageously reduce the objectionability of light diffraction of the laser ablated surface, reduce damage to the laser ablated surface (e.g., the conductive layer 40, ITO, the second surface 20, etc.), provide higher conductivity coatings, facilitate more efficient (e.g., easier and/or quicker, etc.) detachment or removal of the coating layer 14 at each laser spot, reduce processing times (e.g., the total time required to ablate the desired area of a substrate, etc.), and/or still other advantages relative to the non-interleaving, linear serpentine laser ablation process.

Figure 7:
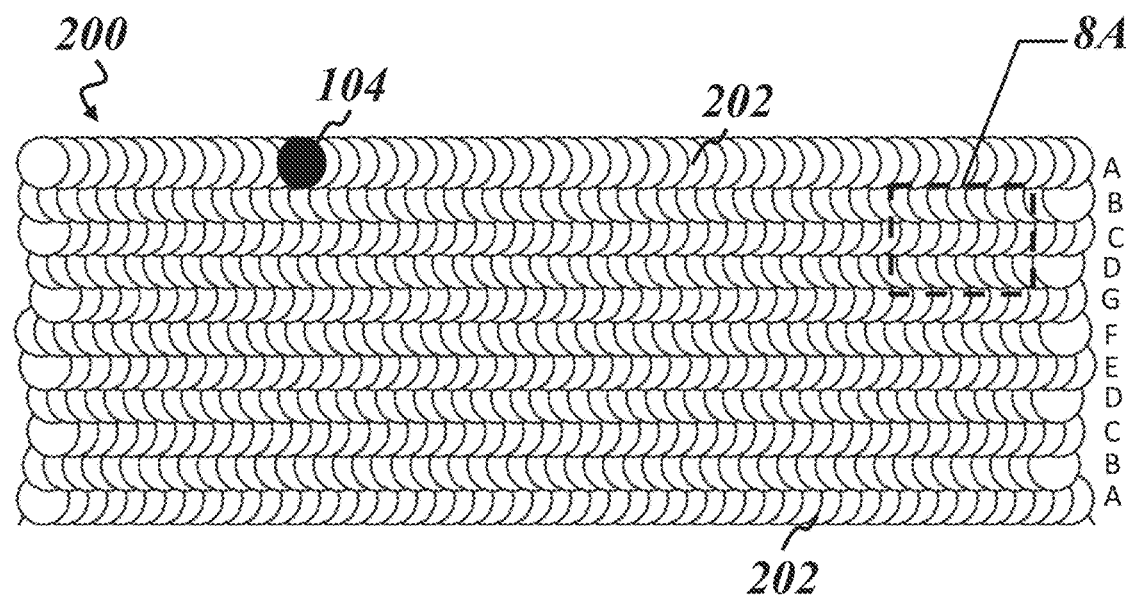
FIG. 7 is a schematic view of a linear serpentine laser ablated surface, according to an exemplary embodiment.
Figure 8A:
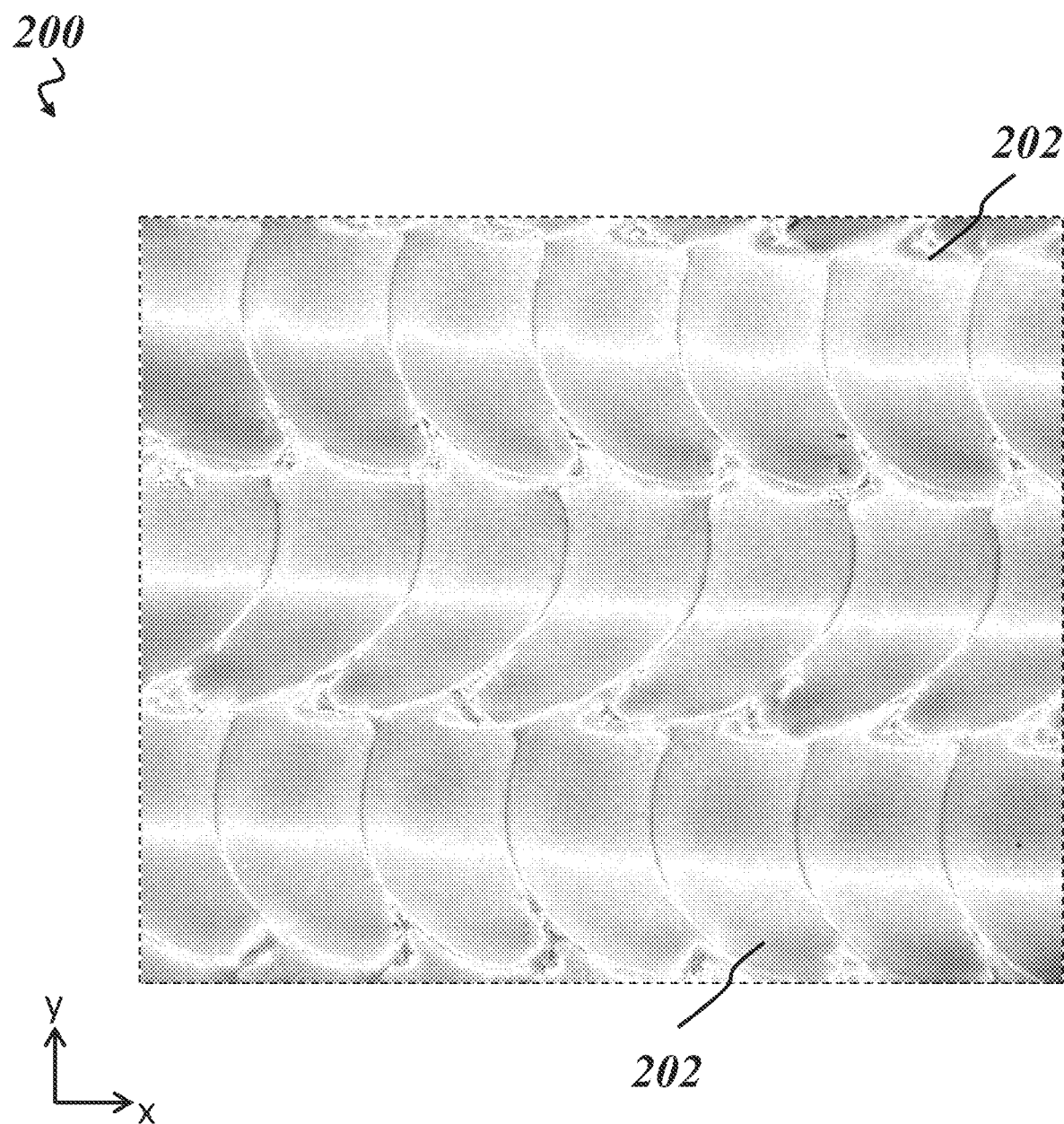
FIGS. 8A and 8B are detailed schematic views of the linear serpentine laser ablated surface of FIG. 7, according to an exemplary embodiment.
Figure 8B:
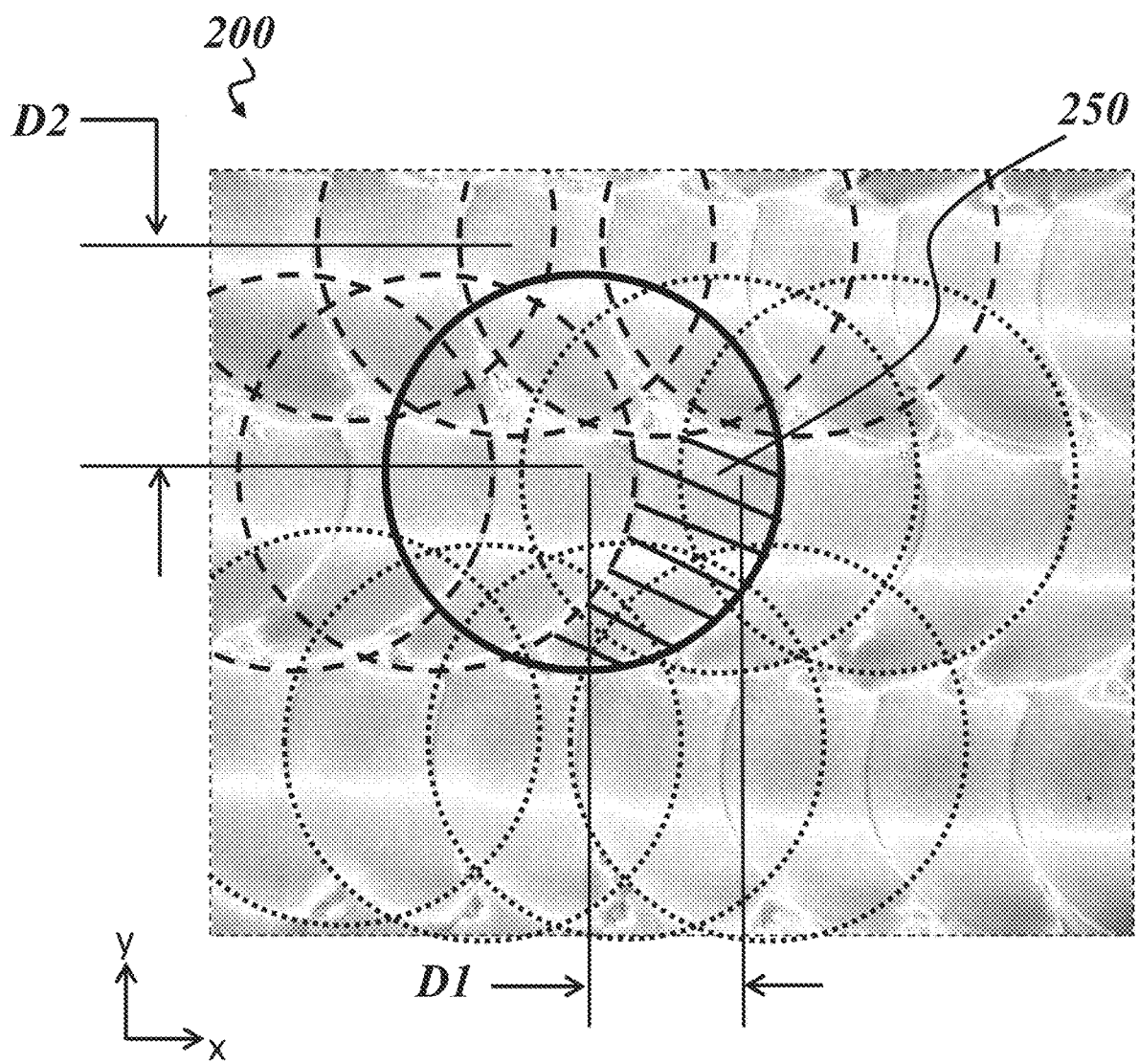

Referring to FIGS. 7-8B, an example of a first surface profile, shown as linear serpentine surface profile 200, of a workpiece after coating material (e.g., the coating layer 14, etc.) has been removed from the workpiece (e.g., from the second surface 20, the conductive layer 40, the ITO, etc.) by a non-interleaving, linear serpentine laser ablation process is shown, according to an exemplary embodiment. As shown in FIGS. 7 and 8A, the linear serpentine surface profile 200 has a plurality of laser spots, shown as laser spots 202. In FIG. 8B, spacing D1 represents the spacing between adjacent laser spots 202 in the x-direction (i.e., the process direction), and spacing D2 represents the spacing between adjacent rows (e.g., rows A-G, etc.) of laser spots 202 in the y-direction (i.e., the transverse direction). The location of an arbitrary single laser spot 104 is darkened in row D of FIG. 7 for illustrative purposes. The shape of each laser spot 202 is generally circular. Depending on the manner of laser beam/substrate movement in the process direction, a circular laser beam may form elliptical laser spots 202. In this particular example, the diameter of the laser spots 202 is approximately double (e.g., slightly less than double, etc.) the spacing D2 between rows, and the spacing D1 between laser spots in the process direction is approximately one-third the diameter of the laser spots 202. By way of example, the diameter of the laser spots 202 may be approximately 200 micrometers ($\mu m$), the spacing D1 may be approximately 75 $\mu m$, and spacing D2 may be approximately 130 $\mu m$. In other embodiments, spacing D2 is less than the diameter of the laser spots 202 and spacing D1 is greater than one-third the diameter of the laser spots 202, but less than one-half the diameter of the laser spots 202. Therefore, consecutive laser spots 202 and adjacent rows may be substantially overlapping and/or touching when using a non-interleaving, linear serpentine laser ablation process (e.g., up to 75% overlap, etc.), which may damage more of the conductive layer 40 and cause increased light diffraction. Also in this example, the process direction of one row is opposite from the process direction of an adjacent row (e.g., a serpentine pattern, etc.). In particular, the process direction of row A of FIG. 7 is from left-to-right, row B is right-to-left, row C is left-to-right, etc. Thus, the non-interleaving, linear serpentine laser ablation process includes a single pass of the laser beam that serpentines across the entire workpiece, removing all of the coating material 14, which thereby provides the linear serpentine surface profile 200 shown in FIGS. 7 and 8A. Typically, the relative positions of the lasers spots 202 in adjacent rows are uncontrolled in a linear serpentine laser ablation process (i.e., the offset between laser spots in adjacent rows is random).

Spot size, shape, and/or overlap in the x-direction and/or the y-direction may be different than illustrated in FIGS. 7 and 8A. But for a non-interleaving, linear serpentine laser ablation process, the resultant surface profile of the workpiece has a regular or uniform pattern of laser spots. In some instances, such a regular pattern of laser spots may lead to undesirable visual effects at the ablated surface (e.g., the conductive layer 40, ITO, the second surface 20, etc.), as is described in more detail herein.

As shown in FIG. 8B, a current laser spot 202 of the linear serpentine surface profile 200 is represented by a solid circle, previously applied laser spots 202 that are overlapped by the current laser spot 202 are represented by long-dashed circles, and laser spots 202 that will be applied in the future and overlap the current laser spot 202 are represented by short-dash circles. According to the exemplary embodiment shown in FIG. 8B, the current laser spot 202 overlaps six previously applied laser spots 202 and will be overlapped by six future applied laser spots 202. Each respective laser spot 202 is therefore overlapped by a total of twelve laser spots 202. Such extensive overlap causes the area of each laser spot 202 to be overlapped by more than 100% because not only the entire area of each laser spot 202 is overlapped, but multiple portions of each laser spot 202 are overlapped multiple times. Such extensive overlap can provide undesirable characteristics, as described further herein. As shown in FIG. 8B, the current laser spot 202 removes a portion 250 of the coating layer 14 (i.e., based on the portion of the current laser spot 202 that does not overlap the previously applied laser spots 202). Based on the overlap with the previously applied laser spots 202, the portion 250 is approximately less than one-third of the area of the current laser spot 202. By way of example, if the laser spots 202 have a diameter of 200 $\mu m$, the area of each laser spot 202 is approximately 31,416 $\mu m^2$. With the amount of overlap with the previously applied laser spots 202, the area of the portion 250 of the current laser spot 202 that removes the coating layer 14 is approximately 9,750 $\mu m^2$, or 31% of the area of the current laser spot 202.

Figure 9:
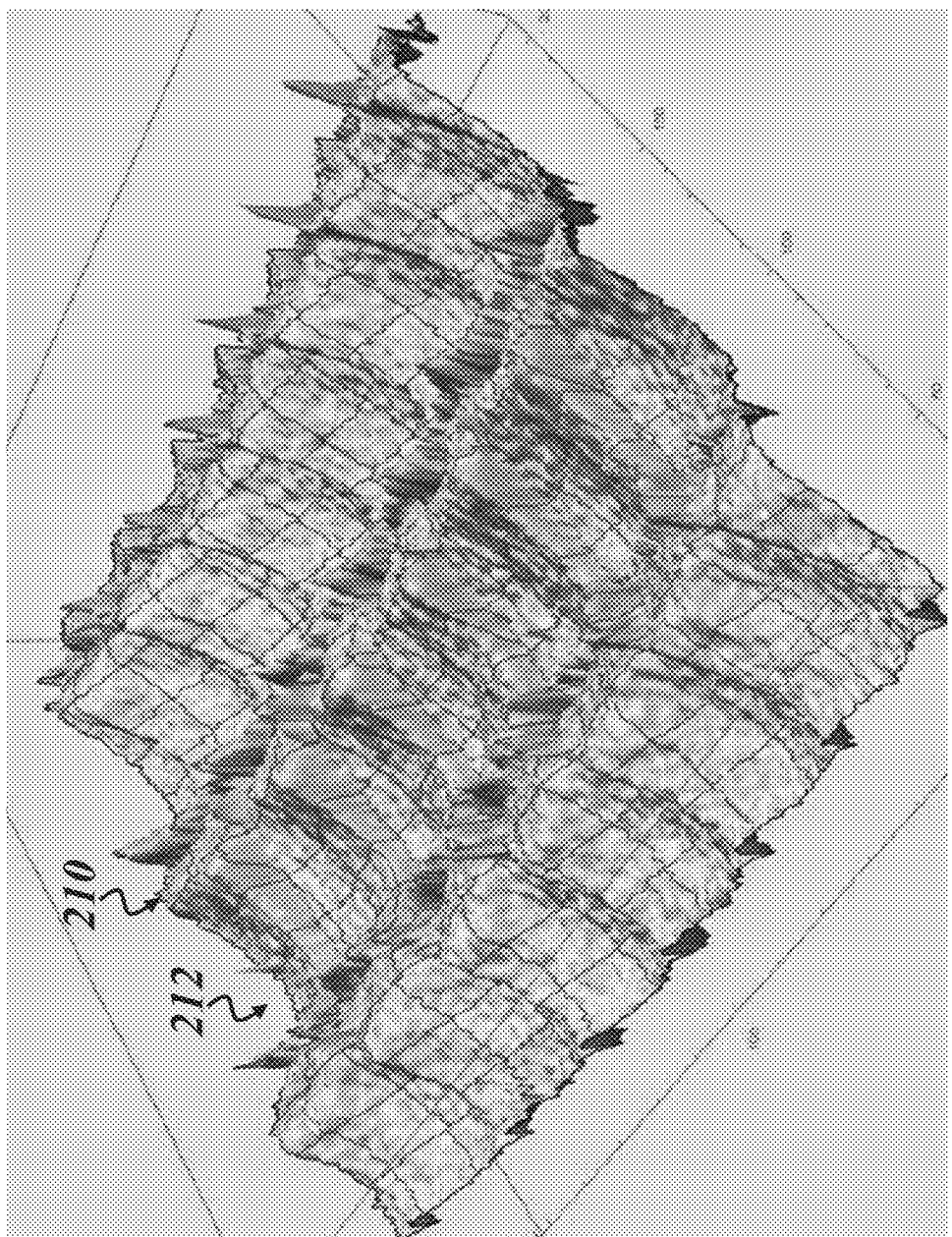
FIG. 9 is a white-light interferometer measured three-dimensional perspective surface profile of the linear serpentine laser ablated surface of FIG. 7, according to an exemplary embodiment.

Referring to FIG. 9, a three-dimensional depiction of the linear serpentine surface profile 200 $n$ (e.g., measured using a white light interferometer, etc.) is show, according to an exemplary embodiment. As shown in FIG. 9, the linear serpentine surface profile 200 has a regular, uniform, periodic shape (e.g., non-random, has a discernible repeating pattern, has sinusoidal characteristics, a wave structure, etc.). The linear serpentine surface profile 200 has a plurality of peaks, shown as peaks 210, and a plurality of valleys, shown as valleys 212. An amplitude of each of the peaks 210 and each of the valleys 212 defines a height (e.g., a peak-to-valley dimension, etc.) of the linear serpentine surface profile 200. The height of the linear serpentine surface profile 200 is approximately 20 nm. As shown in FIG. 9, the peaks 210 and the valleys 212 have a characteristic pattern that favors a single direction (i.e., the scan direction), which results in a "wave-like" pattern to an observer.

Figure 10A:
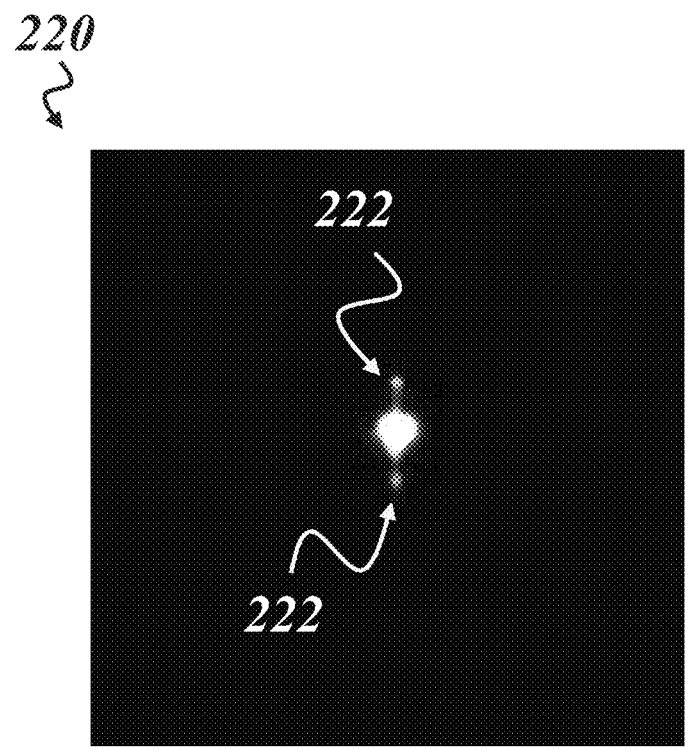
FIGS. 10A and 10B are diffracted light patterns for the linear serpentine laser ablated surface of FIG. 7, according to an exemplary embodiment.
Figure 10B:
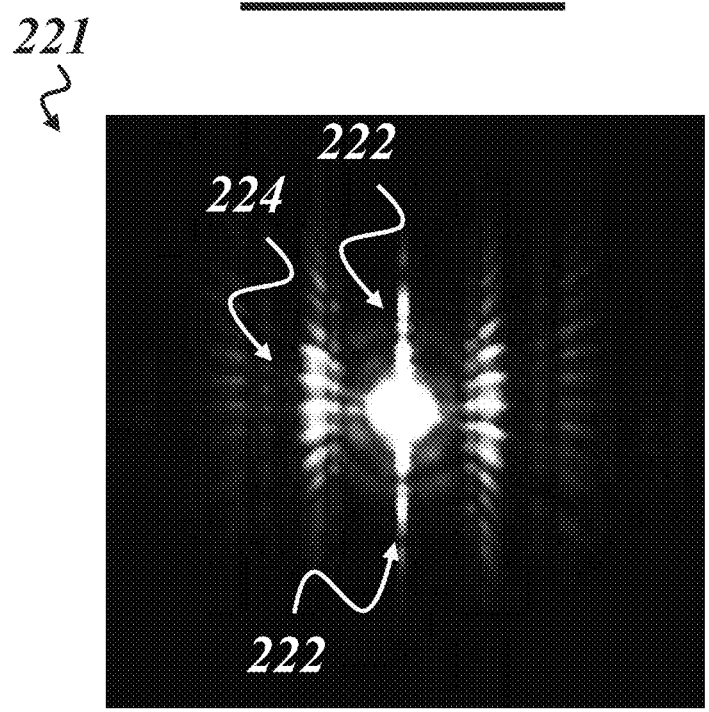

Referring to FIG. 10A, a low intensity diffracted light pattern 220 for the linear serpentine surface profile 200 is shown, according to an exemplary embodiment. As shown in FIG. 10A, the low intensity diffracted light pattern 220 for the linear serpentine surface profile 200 (e.g., measured using a vision system, etc.) includes a pair of dots, shown as dots 222. According to an exemplary embodiment, the dots 222 indicate light that is being diffracted by the linear serpentine surface profile 200. More particularly, the dots 222 of the diffracted light pattern 220 indicate the amount of light that is diffracted by the linear serpentine surface profile 200 as a function of angle. The brightness and/or color of the dots 222 (e.g., intensity, clarity, whiteness, etc.) may indicate an amount of light diffracted by the linear serpentine surface profile 200 for a particular angle (e.g., a brighter, more intense, and/or more white dot 222 indicates a relatively greater amount of light diffraction, etc.). Referring to FIG. 10B, a high intensity diffracted light pattern 221 for the linear serpentine surface profile 200 is shown, according to an exemplary embodiment. As shown in FIG. 10B, the high intensity diffracted light pattern 221 for the linear serpentine surface profile 200 includes the dots 222, as well as a plurality of dots 222 that form linear diffraction lines 224 on opposing sides of a location at which the light is shown onto the linear serpentine surface profile 200.

Figure 11:
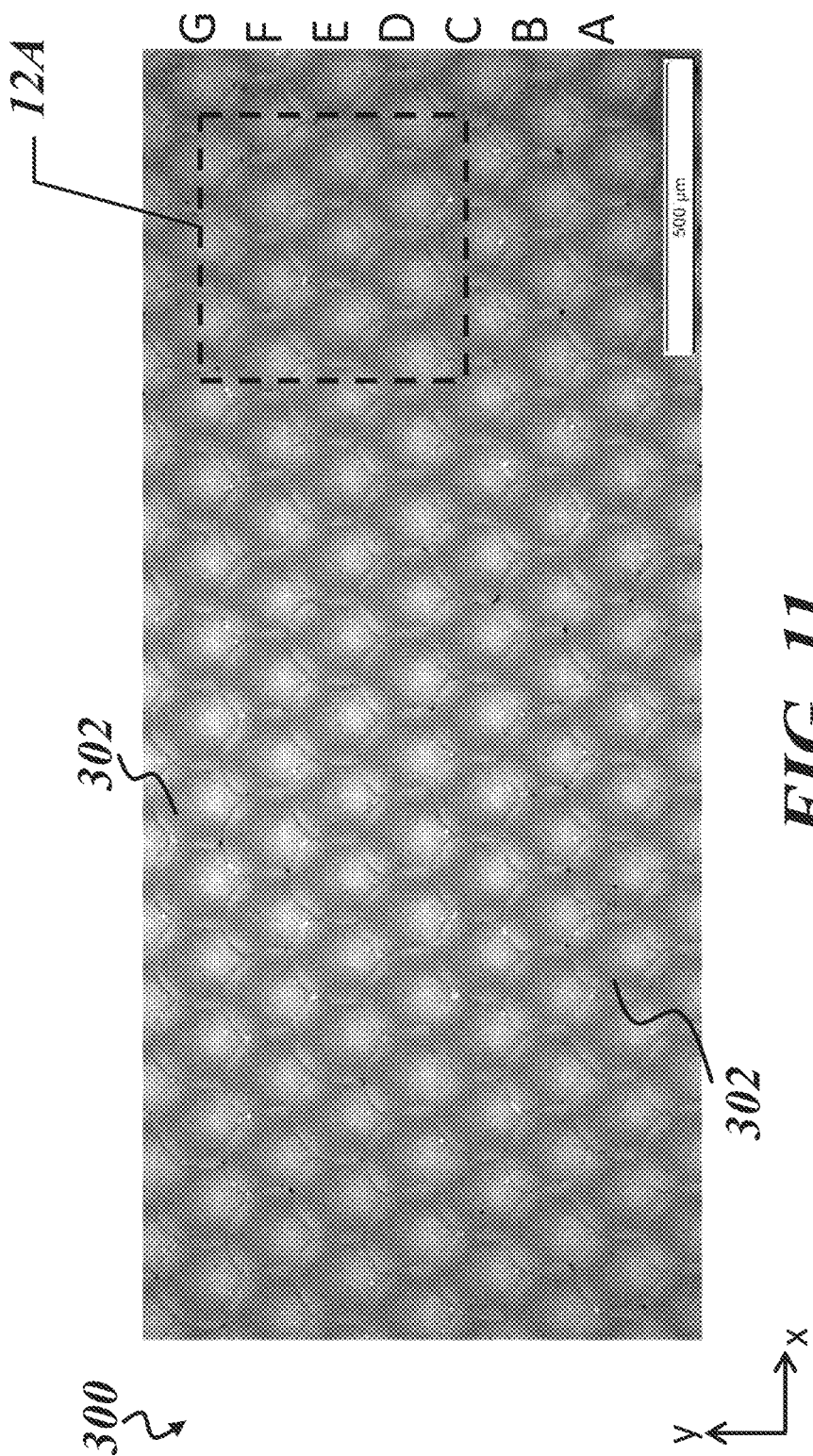
FIG. 11 is a schematic view of a hexagonal packing laser ablated surface, according to an exemplary embodiment.
Figure 12A:
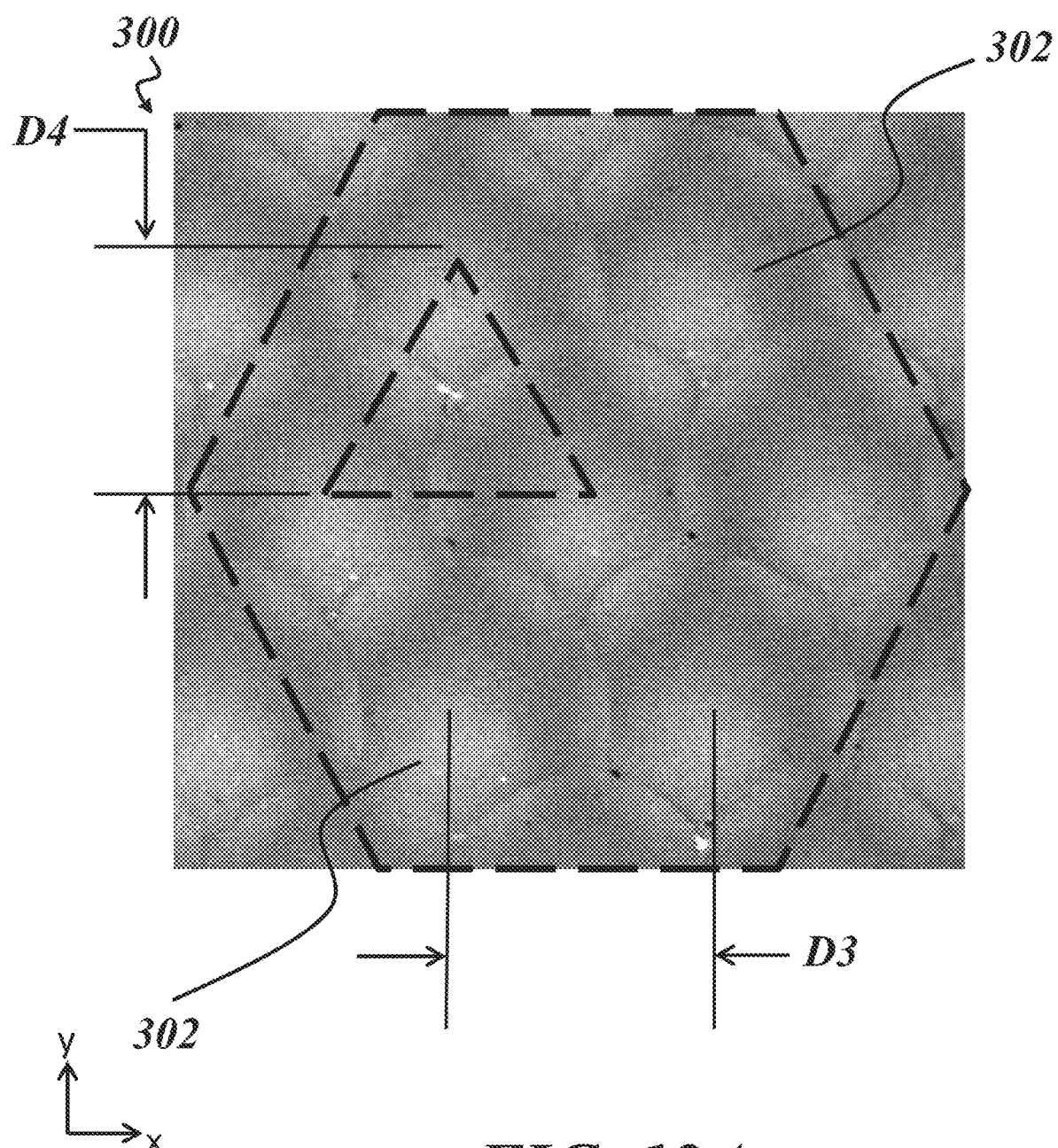
FIGS. 12A and 12B are detailed schematic views of the hexagonal packing laser ablated surface of FIG. 11, according to an exemplary embodiment.
Figure 12B:
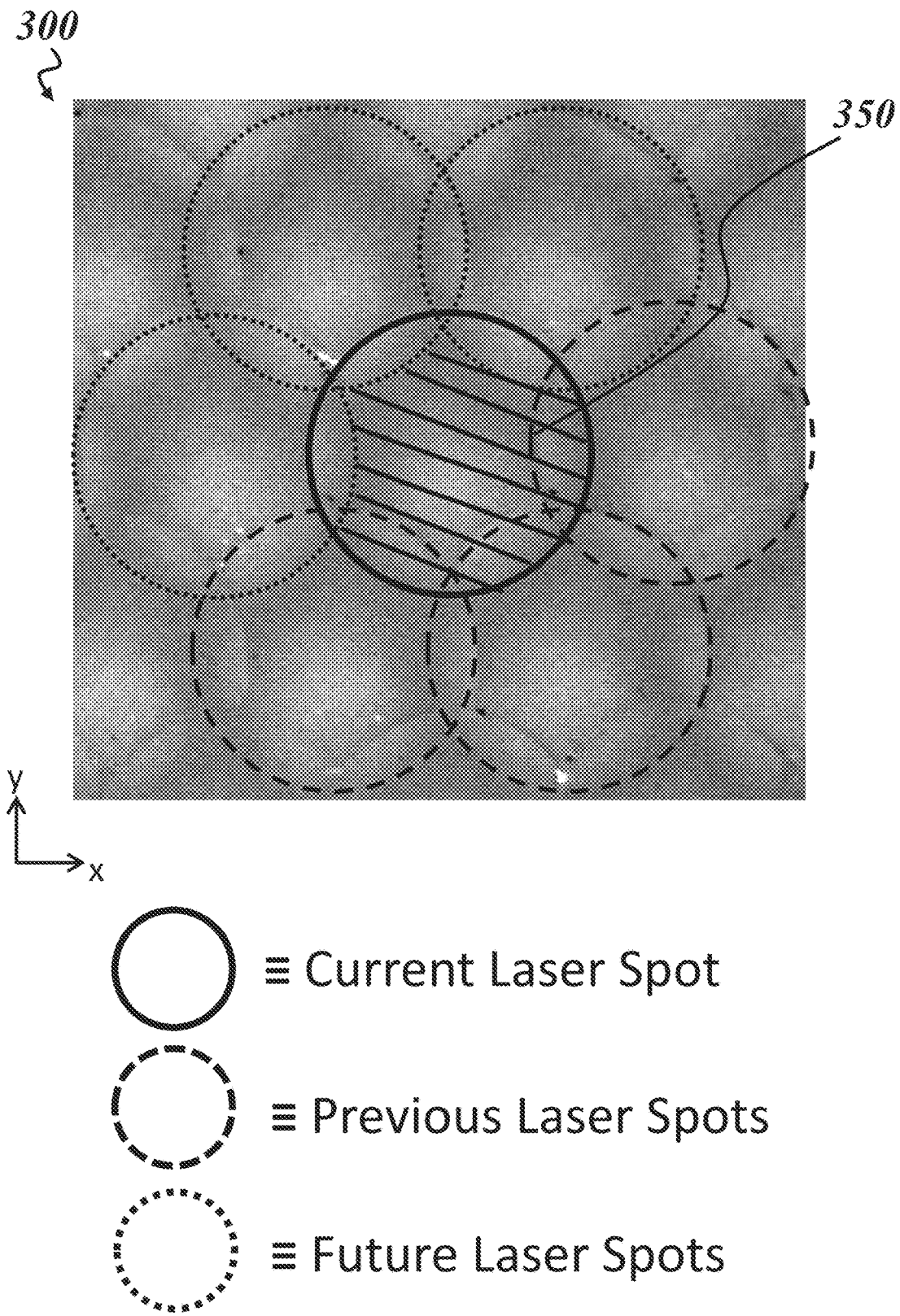

Referring now to FIGS. 11-12B, an example of a second surface profile, shown as hexagonal packing surface profile 300, of a workpiece after coating material (e.g., the coating layer 14, etc.) has been removed from the workpiece (e.g., from the second surface 20, the conductive layer 40, the ITO, etc.) by a hexagonal packing and/or an interleaving hexagonal packing laser ablation process is shown, according to an exemplary embodiment. As shown in FIGS. 11 and 12A, the hexagonal packing surface profile 300 has a plurality of laser spots, shown as laser spots 302. The laser spots 302 may be formed in a single pass (e.g., a linear, serpentine hexagonal packing laser ablation process, etc.) or in multiple passes (e.g., a line interleaving hexagonal packing laser ablation process, a multi-pass interleaving hexagonal packing laser ablation process, etc.).

In FIG. 12A, spacing D3 represents the spacing between adjacent laser spots 302 (i.e., pulse spacing) in the x-direction (i.e., the process direction), and spacing D4 represents the spacing between adjacent rows (e.g., rows A-G, etc.) of laser spots 302 (i.e., pitch) in the y-direction (i.e., the transverse direction). The spacing D3 may be approximately 70% of the diameter of the laser spots 302 (e.g., laser spots 302 with a diameter of 200 μm have a pulse spacing of 140 μm, etc.). In other embodiments, the spacing D3 is at least 50% of the diameter of the laser spots 302. According to an exemplary embodiment, the spacing D3 or the pulse spacing may be represented by the following expression:

$$D3 = \frac{v_{scan}}{\lambda_{laser}} \quad (1)$$

where $v_{scan}$ is the scan speed of the laser source 102 and $\lambda_{laser}$ is repetition rate of the laser 100. For example, for a scan speed of 56 meters per second (m/s) and a repetition rate of 400,000 kilohertz (kHz), the spacing D3 or pulse spacing between adjacent laser spots 302 is 140 μm. The spacing D4 or pitch may be represented by the following expression:

$$D4 = \frac{\sqrt{3}}{2} \cdot D3 \quad (2)$$

Spacing D4 may thereby be approximately 86.6% of the spacing D3. For example, the spacing D4 or pitch between adjacent rows of the laser spots 302 having a pulse spacing of 140 μm may be approximately 121 μm. In other embodiments, spacing D4 is less than 86.6% of the spacing D3 (e.g., 70%, 80%, etc.) such that the hexagonal packing surface profile 300 has lines of laser spots 302 that are close packed or more tightly packed. In yet other embodiments, spacing D4 is greater than 86.6% of the spacing D3 (e.g., 90%, 100%, 105%, etc.) such that the hexagonal packing surface profile 300 has lines of laser spots 302 that are loose packed or stretched. More details regarding the stretched concept is provided herein.

Further, in the hexagonal packing laser ablation process, the offset of laser spots 302 in adjacent rows may be accurately controlled. As shown in FIG. 12A, the laser spots 302 of adjacent rows may be shifted or offset relative to each other by half the spacing D3 or pulse spacing such that the center of the laser spots 302 in a respective row align with the center of two overlapping laser spots 302 in the preceding row and the subsequent row. For example, the center of a laser spot 302 in a respective row (e.g., row E, etc.) may be shifted half the pulse spacing or distance D3 (e.g., 70 μm, etc.) relative to the center of the neighboring laser spots 302 in a preceding row (e.g., row D, etc.) and a subsequent row (e.g., row F, etc.). In some embodiments, the laser source 102 provides the center of the laser spots 302 of a respective row within a range of the center of two overlapping laser spots 302 in the preceding row and the subsequent row. By way of example, the center of the laser spots 302 of a respective row may be within X % (e.g., 5%, 10%, 15%, 20%, etc.) of the value of the distance D3 from the center of two overlapping laser spots 302 in the preceding row and the subsequent row. By way of example, with a spacing D3 of 140 μm, the laser source 102 may provide the center of the laser spots 302 of a respective row within approximately 10 μm of the center of two overlapping laser spots 302 in the preceding row and the subsequent row. Even with such spacing from the center of the two laser spots 302 above and/or the two laser spots 302 below a respective laser spot 302, hexagonal packing may still be substantially provided. In other embodiments, the rows of the laser ablated surface are not offset relative to each other such that a square packing surface profile may be provided. In such a square packing embodiment, the spacing D3 and the spacing D4 may be reduced relative to that of hexagonal packing (e.g., such that the entire desired area is effectively ablated, etc.).

As shown in FIGS. 11 and 12A, a respective laser spot 302 of the hexagonal packing surface profile 300 has six adjacent laser spots 302 surrounding the respective laser spot 302, the centers of each all approximately equidistant from the center of the respective laser spot 302 (e.g., equal to the pulse spacing or distance D3, 140 μm, etc.) forming a hexagonal shape with an equilateral triangle formed between the centers of each set of three neighboring laser pulses 302.

As shown in FIG. 12B, a current laser spot 302 of the hexagonal packing surface profile 300 is represented by a solid circle, previously applied laser spots 302 that are overlapped by the current laser spot 302 are represented by long-dashed circles, and laser spots 302 that will be applied in the future and overlap the current laser spot 302 are represented by short-dash circles. According to an exemplary embodiment, the laser spots 302 of the hexagonal packing surface profile 300 overlap substantially less than the laser spots 202 of the linear serpentine surface profile 200. According to the exemplary embodiment shown in FIG. 12B (e.g., in a non-interleaving embodiment), the current laser spot 302 overlaps three previously applied laser spots 302 and will be overlapped by three future applied laser spots 302. Each respective laser spot 302 is therefore overlapped by a total of six laser spots 302. Such a reduced overlap relative to the liner serpentine surface profile 200 causes the area of each laser spot 302 to be overlapped by substantially less than 100%. By way of example, the amount of overlap that each laser spot 302 may experience may be less than 80% of the area of each laser spot 302. In some embodiments, as much as 65% of the area of each laser spot 302 is not overlapped by the adjacent lasers spots 302 (i.e., a maximum non-overlapped area around 65%). In one embodiment, the area of each laser spot 302 that is not overlapped by the adjacent lasers spots 302 (i.e., the non-overlapped area of the laser spots 302) is between 35-55% (i.e., between a 45-65% overlap). By way of example, in an embodiment where the laser spots 302 have a diameter of 200 µm, a pulse spacing of 140 µm, and a pitch of 121 µm, the area of each laser spot 302 that is not overlapped by the adjacent lasers spots 302 is approximately 35% (i.e., a 65% overlap). By way of another example, in an embodiment where the laser spots 302 have a diameter of 180 µm, a pulse spacing of 140 µm, and a pitch of 121 µm, the area of each laser spot 302 that is not overlapped by the adjacent lasers spots 302 is approximately 53% (i.e., a 47% overlap). By requiring less overlap to complete the ablation process, the hexagonal packing surface profile 300 may be (i) produced in a shorter cycle time by facilitating the use of a lesser number of laser pulses to ablate the desired area and (ii) reduce the amount of the conductive layer 40 (e.g., ITO, etc.) that is removed/damaged from the ablated surface of the workpiece 10 (e.g., the second surface 20 of the substrate 12, etc.). Removing or damaging less of the conductive layer 40 may effectively maintain a higher conductivity of the ablated surface.

As shown in FIG. 12B, the current laser spot 302 removes a portion 350 of the coating layer 14 (i.e., based on the portion of the current laser spot 302 that does not overlap the previously applied laser spots 302). Based on the overlap with the previously applied laser spots 302, the portion 350 is approximately greater than at least one-half of the area of the current laser spot 302. By way of example, if the laser spots 302 have a diameter of 200 µm, the area of each laser spot 302 is approximately 31,416 µm². With the amount of overlap with the previously applied laser spots 302, the area of the portion 350 of the current laser spot 302 that removes the coating layer 14 is at least approximately 16,940 µm², or at least 54% or more of the area of the current laser spot 302. In some embodiments, the area of the portion 350 of the lasers spots 350 is as much as 82.5% of the area of the laser spots 302. By way of example, in an embodiment where 65% of the area of each laser spot 302 is not overlapped, the area of the portion 350 of each laser spot 302 is approximately 82.5%. By way of another example, in an embodiment where 53% of the area of each laser spot 302 is not overlapped, the area of the portion 350 of each laser spot 302 is approximately 76.5%. By way of yet another example, in an embodiment where 35% of the area of each laser spot 302 is not overlapped, the area of the portion 350 of each laser spot 302 is approximately 67.5%.

Figure 13:
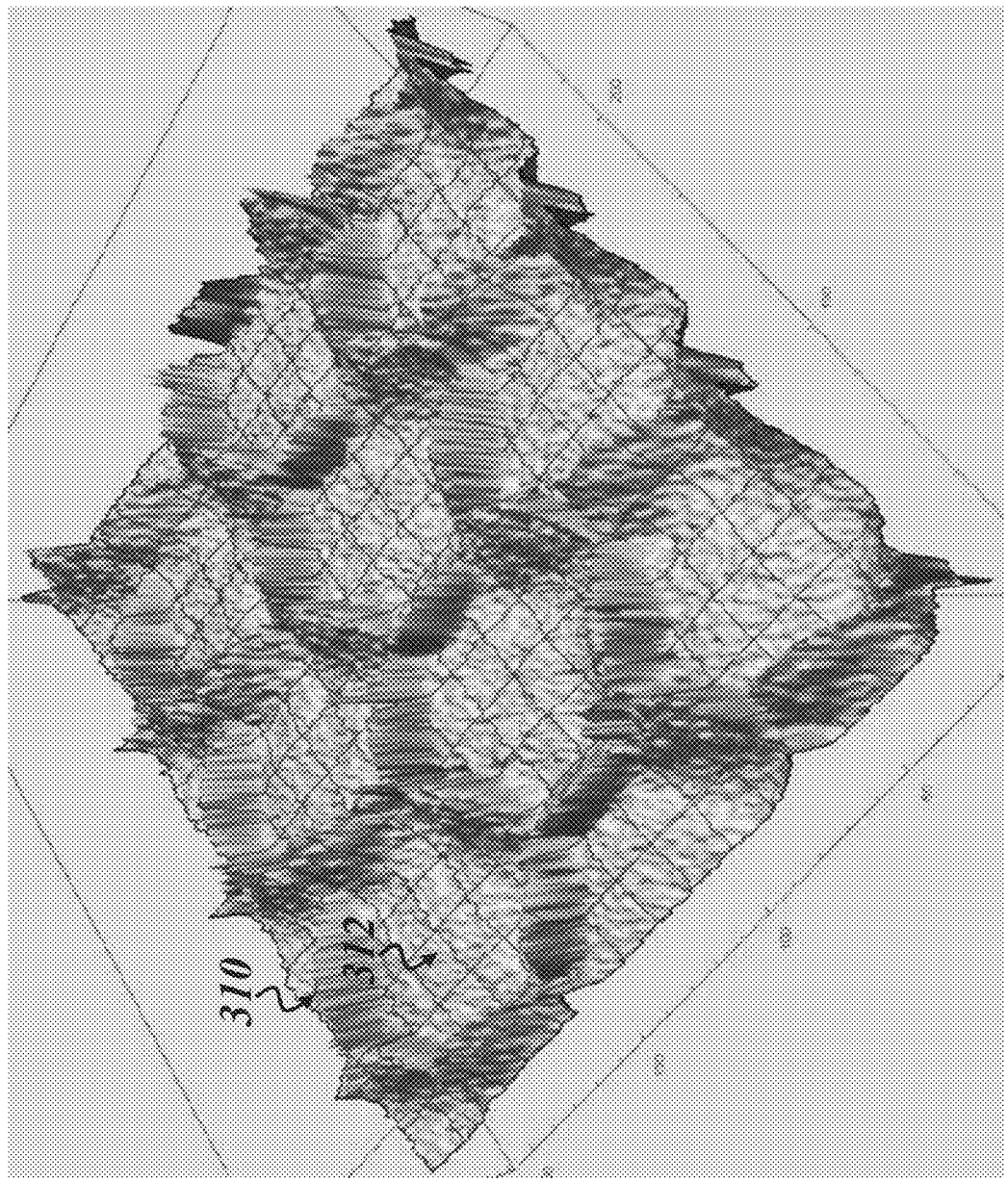
FIG. 13 is a white-light interferometer measured three-dimensional perspective surface profile of the hexagonal packing laser ablated surface of FIG. 11, according to an exemplary embodiment.

Referring to FIG. 13, a three-dimensional depiction of the hexagonal packing surface profile 300 (e.g., measured using a white light interferometer, etc.) is shown, according to an exemplary embodiment. As shown in FIG. 13, the hexagonal packing surface profile 300 has a plurality of peaks, shown as peaks 310, and a plurality of valleys, shown as valleys 312, that define a repeating hexagonal pattern across the hexagonal packing surface profile 300. The hexagonal packing surface profile 300 thereby does not have the same wave-like structure exhibited by the linear serpentine surface profile 200. An amplitude of each of the peaks 310 and each of the valleys 312 defines a height (e.g., a peak-to-valley dimension, etc.) of the hexagonal packing surface profile 300. The height of the hexagonal packing surface profile 300 may be approximately 20 nm.

Figure 14A:
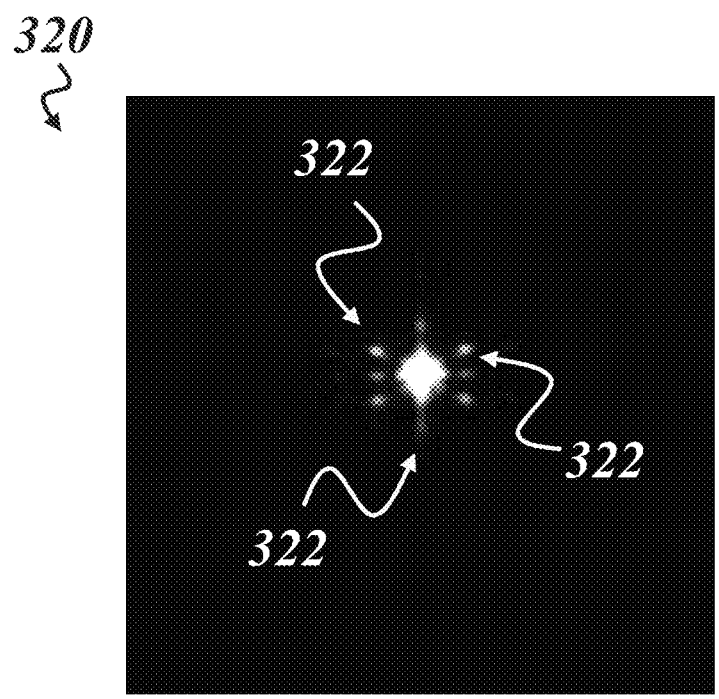
FIGS. 14A and 14B are diffracted light patterns for the hexagonal packing laser ablated surface of FIG. 11, according to an exemplary embodiment.
Figure 14B:
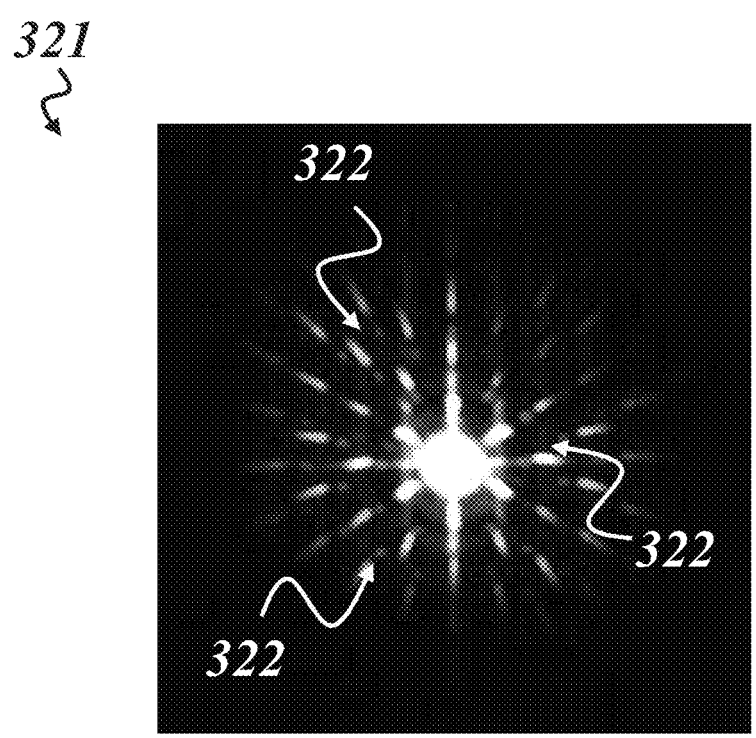

Referring to FIG. 14A, a low intensity diffracted light pattern 320 for the hexagonal packing surface profile 300 is shown, according to an exemplary embodiment. As shown in FIG. 14A, the low intensity diffracted light pattern 320 for the hexagonal packing surface profile 300 (e.g., measured using a vision system, etc.) includes six dots, shown as dots 322. According to an exemplary embodiment, the dots 322 indicate light that is being diffracted by the hexagonal packing surface profile 300. More particularly, the dots 322 of the diffracted light pattern 320 indicate the amount of light that is diffracted by the hexagonal packing surface profile 300 as a function of angle. The brightness and/or color of the dots 322 (e.g., intensity, clarity, whiteness, etc.) may indicate an amount of light diffracted by the hexagonal packing surface profile 300 for a particular angle (e.g., a brighter, more intense, and/or more white dot 322 indicates a relatively greater amount of light diffraction, etc.). Referring to FIG. 14B, a high intensity diffracted light pattern 321 for the hexagonal packing surface profile 300 is shown, according to an exemplary embodiment. As shown in FIG. 14B, the high intensity diffracted light pattern 321 for the hexagonal packing surface profile 300 includes a plurality of the dots 322 extending linearly in six directions.

According to an exemplary embodiment, the hexagonal packing surface profile 300 provides an improved laser ablated surface that provides improved light diffraction characteristics relative to the linear serpentine surface profile 200. By way of example, the light diffraction characteristics of the hexagonal packing surface profile 300 may be better or less objectionable than the light diffraction characteristics of the linear serpentine surface profile 200 due to the hexagonal packing surface profile 300 at least one of (i) reducing the total amount of light diffracted by the laser ablated surface and (ii) reducing the peak intensity of the light diffracted by the laser ablated surface (e.g., by spreading out the diffracted light, by reducing the amount of light diffracted at any particular angle, etc.). As shown in FIGS. 10A and 14A, the low intensity diffracted light pattern 320 of the hexagonal packing surface profile 300 includes six dots 322 relative to the two dots 222 of the low intensity diffracted light pattern 220 of the linear serpentine surface profile 200. Also, as shown in FIGS. 14A and 14B, the six dots 322 of the diffracted light patterns 320 and 321 are hexagonally symmetric and spread the light diffraction out over six points or directions such that the intensity of diffraction is more uniform (e.g., symmetric, no preferred direction, etc.) and less intense (i.e., reduced) relative to the two dots 222 of the diffracted light patterns 220 and 221 for the same amount of light diffracted. Further, the high intensity diffracted light pattern 221 is directional (i.e., the linear diffraction lines 224), which may cause the diffraction to be more noticeable or distinguishable relative to the dots 322, which may appear to only be slight haze. Square packing would disperse the diffracted light across four points, rather than six of the hexagonal packing. While less effective than the hexagonal packing embodiment, square packing still provides more desirable or less objectionable light diffraction characteristics relative to standard linear serpentine laser ablation.

Referring now to FIGS. 15-17, various different methods to provide the hexagonal packing surface profile 300 are visually presented. As shown in FIG. 15, a first method, shown as single pass hexagonal packing laser ablation process 330, is shown according to an exemplary embodiment. The single pass hexagonal packing laser ablation process 330 includes only first laser spots 302. Therefore, the laser source 102, when implementing the single pass hexagonal packing laser ablation process 330, may linearly serpentine across the workpiece 10 to ablate the second surface 20 of the substrate 12 to remove the coating layer 14 therefrom. During the single pass hexagonal packing laser ablation process 330, the laser source 102 is configured to offset each subsequent row by half the pulse spacing to provide the hexagonal packing surface profile 300. In some embodiments, the single pass hexagonal packing laser ablation process 330 includes ablating a perimeter ring around the area desired to be ablated prior to or after providing the hexagonal packing surface profile 300 (see, e.g., FIG. 3).

As shown in FIG. 16, a second method, shown line interleaving hexagonal packing laser ablation process 332, is shown according to an exemplary embodiment. The line interleaving hexagonal packing laser ablation process 332 includes first laser spots 302 and second laser spots 304. According to an exemplary embodiment, the first laser spots 302 are associated with a first laser ablation pass of the laser beam 100 and the second laser spots 304 are associated with a second pass of the laser beam 100. By way of example, the laser source 102, when implementing the line interleaving hexagonal packing laser ablation process 332, may skip a row after completing each row of first laser spots 302 during a first pass and then ablate the rows that were skipped during the first pass through a second, subsequent pass, generating the second laser spots 304. During the line interleaving hexagonal packing laser ablation process 332, the laser source 102 is configured to offset each row of second laser spots 304 by half the pulse spacing relative to the first laser spots 302 to provide the hexagonal packing surface profile 300. In some embodiments, the line interleaving hexagonal packing laser ablation process 332 includes ablating a perimeter ring around the area desired to be ablated prior to or after providing the hexagonal packing surface profile 300 (see, e.g., FIG. 3). In an alternative embodiment, the line interleaving hexagonal packing laser ablation process 332 includes more than two passes (e.g., three, four, etc.). For example, a three pass embodiment may include skipping two rows between each row that is ablated.

As shown in FIG. 17, a third method, shown as four pass interleaving hexagonal packing laser ablation process 334, is shown according to an exemplary embodiment. The four pass interleaving hexagonal packing laser ablation process 334 includes first laser spots 302, second laser spots 304, third laser spots 306, and fourth laser spots 308. According to an exemplary embodiment, the first laser spots 302 are associated with a first laser ablation pass of the laser beam 100, the second laser spots 304 are associated with a second pass of the laser beam 100, the third laser spots 306 are associated with a third pass of the laser beam 100, and the fourth laser spots are associated with a fourth pass of the laser beam 100. By way of example, the laser source 102, during a first pass when implementing the four pass interleaving hexagonal packing laser ablation process 334, may skip a row after completing each row of first laser spots 302, where the pulse spacing or spacing D3 between successive first laser spots 302 in the same row may be twice the pulse spacing used in the single pass hexagonal packing laser ablation process 330 and the line interleaving hexagonal packing laser ablation process 332 (e.g., such that successive first laser spots 302 do not overlap, etc.). During a second pass, the laser source 102 may provide the second laser spots 304 between each set of first laser spots 302 (e.g., such that successive second laser spots 304 do not overlap, etc.) to finish the ablation of every other row (e.g., the odd numbered rows; rows A, C, E, G, etc.).

During a third pass, the laser source 102 may provide the third laser spots 306 between each row of first laser spots 302 and second laser spots 304, but offset by half the pulse spacing such that the third laser spots 306 are positioned approximately at the center of the intersection between a respective first laser spot 302 and a respective second laser spot 304 (e.g., both above and below each third laser spot 306, etc.). Similar to the first pass, the pulse spacing or spacing D3 between successive third laser spots 306 in the same row may be twice the pulse spacing used in the single pass hexagonal packing laser ablation process 330 and the line interleaving hexagonal packing laser ablation process 332 (e.g., such that successive third laser spots 306 do not overlap, etc.). During a fourth pass, the laser source 102 may provide the fourth laser spots 308 between each set of third laser spots 306 (e.g., such that successive fourth laser spots 308 do not overlap, etc.) to finish the ablation of every other row (e.g., the even numbered rows; rows B, D, F, H, etc.). In some embodiments, the third laser spots 306 are provided prior to the second laser spots 304. In some embodiments, the four pass interleaving hexagonal packing laser ablation process 334 includes ablating a perimeter ring around the area desired to be ablated prior to or after providing the hexagonal packing surface profile 300 (see, e.g., FIG. 3).

As shown in FIG. 17, a first laser spot 302 may overlap one or more adjacent laser spots that are not a first laser spot 302. By way of example, a first laser spot 302 may overlap with two second laser spots 304, two third laser spot 306, and two fourth laser spot 308. Therefore, adjacent laser spots (e.g., consecutive laser spots, etc.) and/or adjacent rows of laser spots of a respective laser ablation pass (e.g., first laser spots 302 of a first laser ablation pass, etc.) may not touch and/or overlap when using the four pass interleaving hexagonal packing laser ablation process 334, but laser spots of different laser ablation passes may overlap (e.g., a first laser spot 302 overlaps a second laser spot 304, etc.).

According to an exemplary embodiment, physically spacing the lines or the laser spots of a respective laser ablation pass (e.g., the first laser spots 302 of the first laser ablation pass, etc.) and temporally spacing overlapping laser spots of consecutive laser ablation passes relative to each other (e.g., a first laser spot of a first laser ablation pass relative to an overlapping second laser spot of a second laser ablation pass, etc.) of the line interleaving hexagonal packing laser ablation process 332 and the four pass interleaving hexagonal packing laser ablation process 334 may provide improved surface characteristics of the hexagonal packing surface profile 300 relative to the linear serpentine surface profile 200 and/or the single pass hexagonal packing laser ablation process 330. According to an exemplary embodiment, such physical and temporal spacing of the line interleaving hexagonal packing laser ablation process 332 and the four pass interleaving hexagonal packing laser ablation process 334 increases heat dissipation within the workpiece (e.g., due to a time delay of up to 100 milliseconds (ms) or more between overlapping pulses relative to 5 ms for the single pass hexagonal packing laser ablation process 330, etc.). Such an increase in heat dissipation may minimize the HAZ, which may reduce damage to the ablated surface (e.g., the conductive layer 40, the ITO, etc.) and, thereby, reduce levels of light diffraction of the laser ablated surface, as well as may facilitate removing the coating material with greater ease and more efficiently. The four pass interleaving hexagonal packing laser ablation process 334 may provide better diffraction characteristics than the line interleaving hexagonal packing laser ablation process 332, which may provide better diffraction characteristics than the single pass hexagonal packing laser ablation process 330. On the other hand, the single pass hexagonal packing laser ablation process 330 is quicker than the line interleaving hexagonal packing laser ablation process 332, which is quicker than the four pass interleaving hexagonal packing laser ablation process 334.

In some embodiments, a stretched hexagonal packing laser ablation process is used that is an adaptation of the single pass hexagonal packing laser ablation process 330. With the stretched hexagonal packing laser ablation process, the pitch between successive lines of laser spots 302 may be up to 20% greater than that of the spacing D4 of the non-stretched or close packed single pass hexagonal packing laser ablation process 330. Applicant has discovered that the amount of the coating layer 14 removed from the substrate 12 depends on the amount of time that has elapsed between the generation of a respective laser spot 302 and the neighboring laser spots 302 thereof. Because of the large differential between (i) the time delay between successive, overlapping laser spots 302 in the same row (e.g., 2.5 µs, 5 µs, relatively short, etc.) and (ii) the time delay between overlapping laser spots 302 in two adjacent rows (e.g., approximately 10 ms on average, relatively long, etc.), a different amount of the coating layer 14 may be removed in the scan or x-direction than in the y-direction (i.e., the laser spots 302 are not a perfect circle, but may be elongated in the y-direction relative to the x-direction). This difference may be due to the amount of heat generated in the x-direction relative to the y-direction. The temperature of the coating near adjacent pulses is higher if little time has elapsed since that adjacent pulse. The time between pulses within a scan direction is very short (e.g., approximately 2.5 µs, etc.), so the coating is hot between successive pulses. This means it may be harder to remove the coating and necessitates a certain amount of overlap. However, the time elapsed between pulses in adjacent lines is relatively longer, so the time between a new pulse and the adjacent pulse from a previous line is much longer (e.g., facilitates cooling of the coating and easier removal thereof, etc.). The overlap required between such pulses in adjacent lines may thereby be less such that the spacing between lines may be "stretched" from perfect hexagonal and still remove all the coating. For example, the heat generated in the x-direction may be greater than in the y-direction because of the greater time delay between vertically overlapping laser spots 302 than horizontally overlapping laser spots 302. Higher heat may effectively reduce the amount of the coating layer 14 that is removed, while lower heat may effectively increase the amount of the coating layer 14 that is removed. Therefore, the elongation in the y-direction relative to the x-direction facilitates increasing (i.e., stretching) the pitch between adjacent lines while still effectively ablating all of the coating layer 14 from the desired area.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A substrate for an electro-optic dimmable device, the substrate comprising:
   a first side;
   an opposing second side having a first portion and a second portion, wherein the substrate is at least partially transparent to visible light; and
   a coating layer disposed over the first portion but not the second portion of the opposing second side of the substrate;
   wherein the second portion has an ablated surface including a hexagonal packed surface profile having a plurality of rows that at least partially overlap, each of the plurality of rows having a plurality of laser spots that at least partially overlap; and
   wherein a diameter of each of the plurality of laser spots, a pulse spacing between each of the plurality of laser spots, and a pitch between the plurality of rows provide a non-overlapped area of each of the plurality of laser spots that is at least 20% of a total area of each of the plurality of laser spots.

2. The substrate of claim 1, wherein the plurality of laser spots of a respective row are laterally offset relative to the plurality of laser spots of a preceding row and a subsequent row.

3. The substrate of claim 1, wherein the lateral offset of the respective row relative to the preceding row and the subsequent row is approximately half the pulse spacing plus or minus 10% such that a center of a respective laser spot of the respective row substantially aligns with a center of two adjacent laser spots in the preceding row and the subsequent row.

4. The substrate of claim 1, wherein the pitch is less than or equal to 86.6% of the pulse spacing such that the hexagonal packed surface profile has a close packed hexagonal packed surface profile.

5. The substrate of claim 1, wherein the pitch is greater than 86.6% of the pulse spacing such that the hexagonal packed surface profile has a stretched hexagonal packed surface profile.

6. The substrate of claim 1, wherein the pulse spacing is less than a diameter of each of the plurality of laser spots, but greater than 50% of the diameter of each of the plurality of laser spots.

7. The substrate of claim 1, wherein the non-overlapped area of each of the plurality of laser spots is at least 35% of the area of each of the plurality of laser spots.

8. The substrate of claim 1, wherein the ablated surface has a periphery surface profile that extends around the hexagonal packed surface profile, and wherein the periphery surface profile is different than the hexagonal packed surface profile.

9. The substrate of claim 1, further comprising a conductive layer disposed underneath the coating layer and covering the first portion and the second portion of the opposing second side of the substrate, wherein the conductive layer includes a transparent conductive oxide.

10. The substrate of claim 1, wherein the coating layer includes a metallic material, and wherein the coating layer is removed from the second portion of the opposing second side of the substrate during a laser ablation process.

11. The substrate of claim 1, wherein the substrate is at least partially transparent such that a laser beam is capable of passing through the first side of the substrate to interact with and remove the coating layer from the second portion of the opposing second side.

12. The substrate of claim 1, wherein the substrate is a mirror configured to be incorporated into the electro-optic dimmable device, the electro-optic dimmable device including at least one of a dimming mirror assembly, a chrome ring product, or an electrochromic mirror assembly.

13. An electro-optic mirror device comprising:
   a substrate having:
      a first surface;
      an opposing second surface; and
      a conductive layer disposed on the opposing second surface;
   wherein the conductive layer has a hexagonally packed surface profile including a plurality of rows, each of the plurality of rows having a plurality of laser spots;
   wherein the plurality of laser spots of each of the plurality of rows have a pulse spacing and the plurality of rows have a pitch;
   wherein the plurality of laser spots of a respective row are laterally offset relative to the plurality of laser spots of a preceding row and a subsequent row, the lateral offset of the respective row relative to the preceding row and the subsequent row being approximately half the pulse spacing such that a center of a respective laser spot of the respective row substantially aligns with a center of two adjacent laser spots in the preceding row and the subsequent row; and
   wherein a diameter of each of the laser spots, the pulse spacing, and the pitch provide a non-overlapped area of each of the plurality of laser spots that is at least 20% of a total area of each of the plurality of laser spots.

14. The electro-optic mirror device of claim 13, wherein the electro-optic mirror device is an electrochromic mirror assembly, wherein the substrate is a first substrate, and wherein the electrochromic mirror assembly further comprises a second substrate spaced from the first substrate forming a gap therebetween.

15. A method for manufacturing a product, the method comprising:
   providing a substrate having a first side and an opposing second side, the opposing second side having a coating layer disposed thereon;
   selecting a diameter of a laser beam, a pulse spacing between adjacent laser spots, and a pitch between rows of laser spots;
   impinging the substrate with the laser beam such that the laser beam propagates through the first side to the opposing second side and interacts with the coating layer to remove the coating layer from the opposing second side, leaving a laser spot on a surface of the opposing second side; and
   moving the laser beam along the substrate to remove the coating layer from at least a portion of the opposing second side of the substrate leaving a plurality of rows, each of the plurality of rows including a plurality of laser spots on the surface of the opposing second side, the plurality of laser spots arranged in a hexagonal packing profile;
   wherein the plurality of laser spots of each row of laser spots have the pulse spacing and the plurality of rows have the pitch;
   wherein the plurality of laser spots of a respective row are laterally offset by approximately half the pulse spacing relative to the plurality of laser spots of a preceding row such that a center of a respective laser spot of the respective row substantially aligns with a center of two adjacent laser spots in the preceding row; and
   wherein the diameter, the pulse spacing, and the pitch provide a non-overlapped area of each of the plurality of laser spots that is at least 20% of a total area of each of the plurality of laser spots.

16. The method of claim 15, wherein moving the laser beam includes:
   moving the laser beam in a first lateral direction to create a first plurality of partially overlapping laser spots in a first row, the spacing of the first plurality of partially overlapping laser spots in the first row spaced based on the pulse spacing;
   stepping the laser beam in a transverse direction based on the pitch; and
   offsetting the laser beam by approximately half the pulse spacing; and
   moving the laser beam in an opposing second lateral direction to create a second plurality of partially overlapping laser spots in a second row, the spacing of the second plurality of partially overlapping laser spots in the second row spaced based on the pulse spacing.

17. The method of claim 15, wherein moving the laser beam includes:
   moving the laser beam in a first lateral direction to create a first plurality of partially overlapping laser spots in a first row, the spacing of the first plurality of partially overlapping laser spots in the first row spaced based on the pulse spacing;
   stepping the laser beam in a first transverse direction based on two times the pitch to a third row;
   moving the laser beam in an opposing second lateral direction to create the first plurality of partially overlapping laser spots in the third row, the spacing of the first plurality of partially overlapping laser spots in the third row spaced based on the pulse spacing;

stepping the laser beam in an opposing second transverse direction between the first row and the third row to a second row;
offsetting the laser beam by approximately half the pulse spacing;
moving the laser beam in the first lateral direction to create a second plurality of partially overlapping laser spots in the second row, the spacing of the second plurality of partially overlapping laser spots in the second row spaced based on the pulse spacing;
stepping the laser beam in the first transverse direction past the third row based on two times the pitch to a fourth row; and
moving the laser beam in the opposing second lateral direction to create the second plurality of partially overlapping laser spots in the fourth row, the spacing of the second plurality of partially overlapping laser spots in the fourth row spaced based on the pulse spacing.

18. The method of claim 15, wherein moving the laser beam includes:
moving the laser beam in a first lateral direction to create a first plurality of laser spots in a first row, the spacing of the first plurality of laser spots in the first row spaced based on two times the pulse spacing, wherein the first plurality of laser spots do not overlap each other;
stepping the laser beam in a first transverse direction based on two times the pitch to a third row;
moving the laser beam in an opposing second lateral direction to create the first plurality of laser spots in the third row, the spacing of the first plurality of laser spots in the third row spaced based on two times the pulse spacing;
stepping the laser beam in an opposing second transverse direction to the first row;
offsetting the laser beam by approximately the pulse spacing;
moving the laser beam in the first lateral direction to create a second plurality of laser spots in the first row between each pair of the first plurality of laser spots, the spacing of the second plurality of laser spots in the first row spaced based on two times the pulse spacing, wherein the second plurality of laser spots do not overlap each other but partially overlap the first plurality of laser spots;
stepping the laser beam in the first transverse direction to the third row;
moving the laser beam in the opposing second lateral direction to create the second plurality of laser spots in the third row between each pair of the first plurality of laser spots, the spacing of the second plurality of laser spots in the third row spaced based on two times the pulse spacing;
stepping the laser beam in the opposing second transverse direction to a second row between the first row and the third row;
moving the laser beam in the first lateral direction to create a third plurality of laser spots in the second row, the spacing of the third plurality of laser spots in the second row spaced based on two times the pulse spacing, wherein the third plurality of laser spots do not overlap each other;
stepping the laser beam in the first transverse direction past the third row based on two times the pitch to a fourth row;
moving the laser beam in the opposing second lateral direction to create the third plurality of laser spots in the fourth row, the spacing of the third plurality of laser spots in the fourth row spaced based on two times the pulse spacing;
stepping the laser beam in the opposing second transverse direction to the second row;
offsetting the laser beam by approximately the pulse spacing;
moving the laser beam in the first lateral direction to create a fourth plurality of laser spots in the second row between each pair of the third plurality of laser spots, the spacing of the fourth plurality of laser spots in the second row spaced based on two times the pulse spacing, wherein the fourth plurality of laser spots do not overlap each other but partially overlap the third plurality of laser spots;
stepping the laser beam in the first transverse direction to the fourth row; and
moving the laser beam in the opposing second lateral direction to create the fourth plurality of laser spots in the fourth row between each pair of the third plurality of laser spots, the spacing of the fourth plurality of laser spots in the fourth row spaced based on two times the pulse spacing.

* * * * *